(12) United States Patent
Ossimitz et al.

(10) Patent No.: US 9,219,031 B2
(45) Date of Patent: Dec. 22, 2015

(54) CHIP ARRANGEMENT, AND METHOD FOR FORMING A CHIP ARRANGEMENT

(71) Applicant: Infineon Technologies AG, Neubiberg (DE)

(72) Inventors: Peter Ossimitz, Munich (DE); Robert Bauer, Moosach (DE); Tobias Jacobs, Dresden (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 154 days.

(21) Appl. No.: 13/892,367

(22) Filed: May 13, 2013

(65) Prior Publication Data

US 2014/0332953 A1 Nov. 13, 2014

(51) Int. Cl.
*H01L 23/498* (2006.01)
*H01L 21/768* (2006.01)
*H01L 23/00* (2006.01)
*H01L 23/14* (2006.01)
*H01L 23/15* (2006.01)

(52) U.S. Cl.
CPC .... *H01L 23/49811* (2013.01); *H01L 21/76885* (2013.01); *H01L 23/49827* (2013.01); *H01L 24/13* (2013.01); *H01L 24/14* (2013.01); *H01L 24/17* (2013.01); *H01L 23/147* (2013.01); *H01L 23/15* (2013.01); *H01L 2224/0345* (2013.01); *H01L 2224/0346* (2013.01); *H01L 2224/03452* (2013.01); *H01L 2224/05023* (2013.01); *H01L 2224/05147* (2013.01); *H01L 2224/05171* (2013.01); *H01L 2224/05184* (2013.01); *H01L 2224/05564* (2013.01); *H01L 2224/05568* (2013.01); *H01L 2224/05573* (2013.01); *H01L 2224/05624* (2013.01); *H01L 2224/05639* (2013.01); *H01L 2224/05647* (2013.01); *H01L 2224/11903* (2013.01); *H01L 2224/13005* (2013.01); *H01L 2224/1312* (2013.01); *H01L 2224/13017* (2013.01); *H01L 2224/13082* (2013.01); *H01L 2224/13083* (2013.01); *H01L 2224/13084* (2013.01); *H01L 2224/13109* (2013.01); *H01L 2224/13111* (2013.01); *H01L 2224/13113* (2013.01); *H01L 2224/13118* (2013.01); *H01L 2224/13139* (2013.01); *H01L 2224/13144* (2013.01); *H01L 2224/13155* (2013.01); *H01L 2224/13164* (2013.01); *H01L 2224/1411* (2013.01); *H01L 2224/17107* (2013.01); *H01L 2224/81193* (2013.01); *H01L 2924/0002* (2013.01)

(58) Field of Classification Search
CPC ........... H01L 2924/01082; H01L 2224/48479; H01L 24/16; H01L 21/563; H01L 25/0657
USPC .......................................................... 257/786
See application file for complete search history.

(56) References Cited

U.S. PATENT DOCUMENTS 6,847,124 B2 * 1/2005 Semi ............................ 257/786

* cited by examiner

Primary Examiner — Roy Potter

(57) ABSTRACT

A chip arrangement may include: a chip including a plurality of electrical nets, wherein each electrical net includes at least one bonding pad; and a plurality of pillars formed on the at least one bonding pad of a majority of the plurality of electrical nets, wherein the plurality of pillars may be configured to connect the at least one bonding pad of the majority of the plurality of electrical nets to a chip-external connection region.

31 Claims, 17 Drawing Sheets

700

Provide chip including at least one bonding pad — 702

Form plurality of pillars on at least one bonding pad, wherein plurality of pillars may be configured to connect at least one bonding pad to chip-external connection region, and wherein ratio of height of at least one pillar of plurality of pillars to width of widest lateral extent of the at least one pillar of plurality of pillars may be greater than or equal to about 2 — 704

FIG. 7

CHIP ARRANGEMENT, AND METHOD FOR FORMING A CHIP ARRANGEMENT

TECHNICAL FIELD

Various embodiments relate to a chip arrangement, and a method for forming a chip arrangement.

BACKGROUND

Many semiconductor structures may include conductive interconnects. The reliability of semiconductor structures may depend at least in part on the reliability of the conductive interconnects. Reliable conductive interconnects may be needed.

SUMMARY

A chip arrangement in accordance with various embodiments may include: a chip including a plurality of electrical nets, wherein each electrical net includes at least one bonding pad; and a plurality of pillars formed on the at least one bonding pad of a majority of the plurality of electrical nets, wherein the plurality of pillars may be configured to connect the at least one bonding pad of the majority of the plurality of electrical nets to a chip-external connection region.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 7 shows a method for forming a chip arrangement in accordance with various embodiments.

DESCRIPTION

The following detailed description refers to the accompanying drawings that show, by way of illustration, specific details and embodiments in which the invention may be practised. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described for structures or devices, and various embodiments are described for methods. It may be understood that one or more (e.g. all) embodiments described in connection with structures or devices may be equally applicable to the methods, and vice versa.

The word "exemplary" is used herein to mean "serving as an example, instance, or illustration". Any embodiment or design described herein as "exemplary" is not necessarily to be construed as preferred or advantageous over other embodiments or designs.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

Modern semiconductor devices may include at least one chip arrangement including at least one integrated circuit (IC) chip connected (directly connected and/or through an intermediary) to at least one element, which may be external to the chip.

Figure 1A:
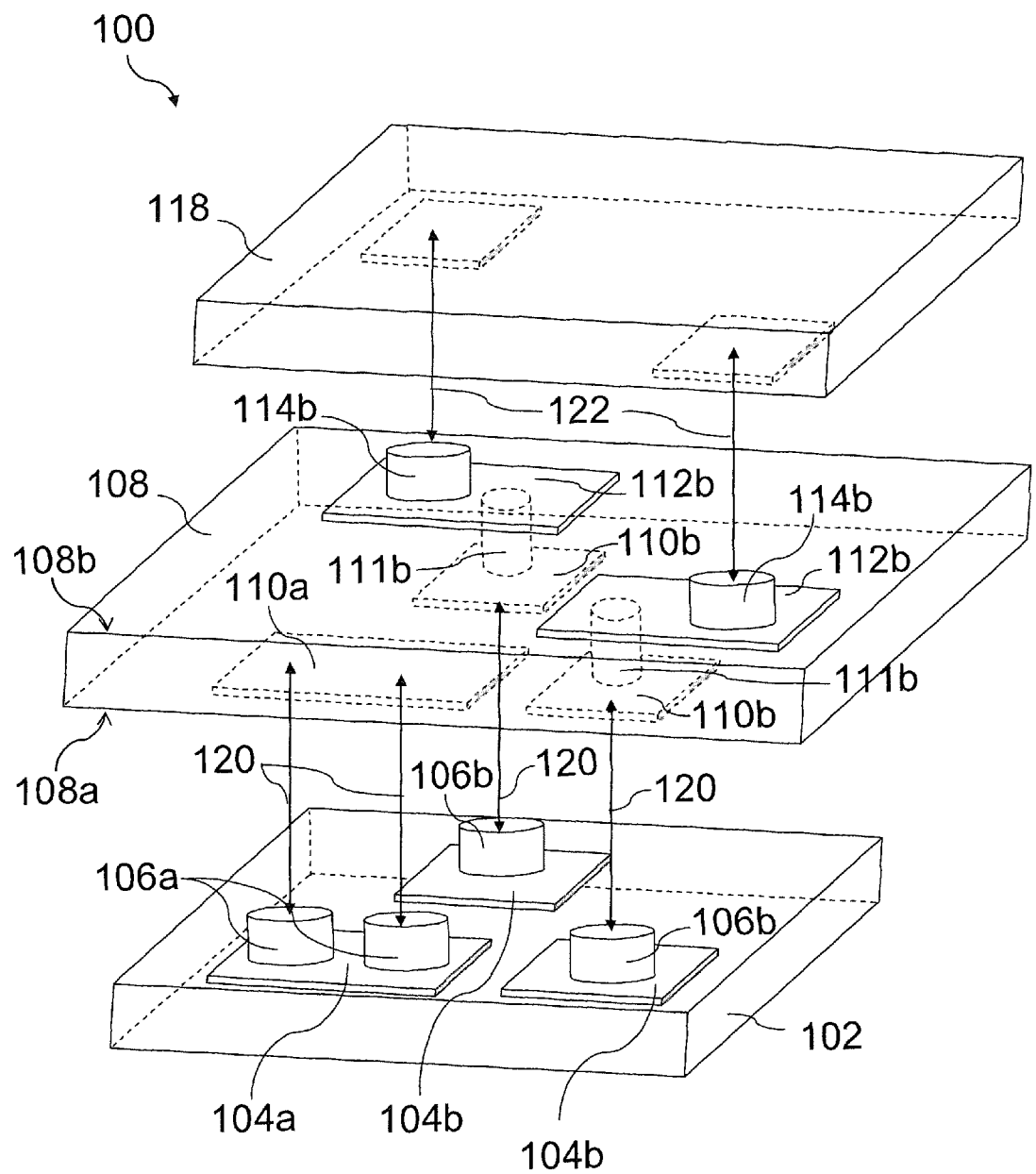
FIG. 1A to FIG. 1E show various views of a conventional chip arrangement.

FIG. 1A shows a perspective view of a part of a conventional chip arrangement.

As shown in FIG. 1A in a view 100, the conventional chip arrangement may include a chip 102. The chip 102 may include a plurality of bonding pads 104a, 104b. A bonding pad of the plurality of bonding pads 104a, 104b may, for example, be an area (e.g. a plane area) at which an electrical and/or mechanical interconnect may be formed (e.g. for connecting the chip 102 to a chip-external element). The plurality of bonding pads 104a, 104b may be formed at a surface of the chip 102 (e.g. an active surface of the chip 102 or a surface opposite the active surface, which may also be referred to as a passive surface of the chip 102).

The plurality of bonding pads 104a, 104b may include a first group of bonding pads 104a (including at least one bonding pad) and a second group of bonding pads 104b (including at least one bonding pad). The first group of bonding pads 104a and the second group of bonding pads 104b may be part of different electrical networks. For example, the first group of bonding pads 104a may belong to a power supply network of the chip 102, and the second group of bonding pads 104b may belong to an input/output signal network of the chip 102. Stated in yet another way, the first group of bonding pads 104a may be part of an electrical network of the chip 102 that may be configured to conduct power supply potentials, and the second group of bonding pads 104b may be part of an electrical network of the chip 102 that may be configured to conduct input/output signals (e.g. signals other than power supply potentials).

In the conventional chip arrangement shown in FIG. 1A the first group of bonding pads 104a (e.g. belonging to a power supply network) may, for example, have at least one conductive interconnect 106a (e.g. a pillar, for example a copper pillar) formed over a bonding pad of the first group of bonding pads 104a. The second group of bonding pads 104b (e.g. belonging to an input/output signal network) may, for example, have one conductive interconnect 106b (e.g. a pillar, for example a copper pillar) formed over a bonding pad of the second group of bonding pads 104b, as shown in FIG. 1A.

The conductive interconnects 106a, 106b may be configured to connect the chip 102 to a chip-external connection region 108. The chip-external connection region 108 may include, or may be, a carrier, for example, a carrier in at least one of a flip-chip package, a wire-bonded chip package, and a 2.5D interposer chip package. In other words, the chip-external connection region 108 may include, or may be, a package for the chip 102. By way of another example, the chip-external connection region 108 may include, or may be, at least one other IC chip (e.g. in a chip face-to-face interconnect). By way of yet another example, the chip-external connection region 108 may include, or may be, a substrate (e.g. a semiconductor substrate) for example a substrate of a package (e.g. a chip package).

The chip-external connection region 108 (e.g. a package) may include a plurality of traces 110a, 110b formed on a surface 108a of the chip-external connection region 108 facing the chip 102. The plurality of traces 110a, 110b may be configured to connect the chip-external connection region 108 (e.g. a package) to the conductive interconnects 106a, 106b formed on the plurality of bonding pads 104a, 104b of the chip 102. The plurality of traces 110a, 110b may include a first group of traces 110a (including at least one trace) configured to connect the chip-external connection region 108 to the at least one interconnect 106a formed over a bonding pad of the first group of bonding pads 104a. In other words, the first group of traces 110a may be configured to connect the chip-external connection region 108 to the first group of bonding pads 104a (e.g. belonging to a power supply network). In one or more embodiments, the first group of traces 110a may include, or may be, a power supply trace. The first group of traces 110a (e.g. a power supply trace) may, for example, be connected to a larger network formed on the chip-external connection region 108 (e.g. a package).

In like manner, the plurality of traces 110a, 110b may include a second group of traces 110b (including at least one trace) configured to connect the chip-external connection region 108 to the interconnect 106b formed over a bonding pad of the second group of bonding pads 104b. In other words, the second group of traces 110b may be configured to connect the chip-external connection region 108 to the second group of bonding pads 104b (e.g. belonging to an input/output signal network). In one or more embodiments, the second group of traces 110b may include, or may be, an input/output signal trace. The second group of traces 110b (e.g. an input/output signal trace) may, for example, be connected to a larger network formed on the chip-external connection region 108 (e.g. a package).

As shown in FIG. 1A, the chip-external connection region 108 may include at least one trace 112b formed on a surface 106b of the chip-external connection region 108 facing away from the chip 102. The at least one trace 112b may be connected to the plurality of traces 110a, 110b (e.g. the second group of traces 110b) by means of, for example, at least one via 111b formed in the chip-external connection region 108 (e.g. formed in a substrate of a package). The chip-external connection region 108 may include an interconnect 114b formed over a trace of the at least one trace 112b. The interconnect 114b may be configured to connect the chip-external connection region 108 to another connection region 118. The other connection region 118 may include, or may be, a board (e.g. a customer board). For example, the other connection region 118 may include, or may be, a printed circuit board to which a packaged chip (including chip 102 and chip-external connection region 108) may be connected to.

As shown in FIG. 1A, the chip arrangement may include a connection between the chip 102 and the chip-external connection region 108 (indicated by reference sign 120). This connection 120 may, for example, include, or may be, a chip-to-package connection. The chip arrangement shown in FIG. 1A may include a connection between the chip-external connection region 108 and the other connection region 118 (indicated by reference sign 122). This connection 122 may, for example, include, or may be, a package-to-board connection. The respective connections 120, 122 may be made, for example, by means of soldering, ultrasonic bonding, an interconnection based on a contact force, or other suitable interconnection methods. In addition, the conductive interconnects 106a, 106b, 114b may include, or may be, a pin, a bonding wire, a solder bump, a pillar, a conductive glue deposit, or other suitable conductive interconnects.

The reliability of a device formed using, for example, the chip arrangement shown in FIG. 1A, may depend on the electrical connection between the chip 102 and the chip-external connection region 108 and/or the electrical connection between the chip-external connection region 108 and the other connection region 118. For example, breakage of the conductive interconnects 106a, 106b, 114b may lead to failure in the chip arrangement shown in FIG. 1A, and thus a semiconductor device including the chip arrangement. Accordingly, chip arrangements may need reliable conductive interconnects that may be resilient and/or robust to breakage and/or warpage and/or stress and strain.

As shown in FIG. 1A, the interconnection between the chip 102 and the chip-external connection region 108 may be formed via the conductive interconnects 106a, 106b and the plurality of traces 110a, 110b. As shown in FIG. 1A, the interconnection between the chip 102 and the chip-external connection region 108 may be made by the conductive interconnects 106a, 106b with a substantially flat surface of the plurality of traces 110a, 110b, which may have a consistent height above the surface 108a of the chip-external connection region 108. However, the interconnection between the chip 102 and the chip-external connection region 108 may be made by the conductive interconnects 106a, 106b with exposed bumps which may be formed on the plurality of traces 110a, 110b.

Figure 1B:
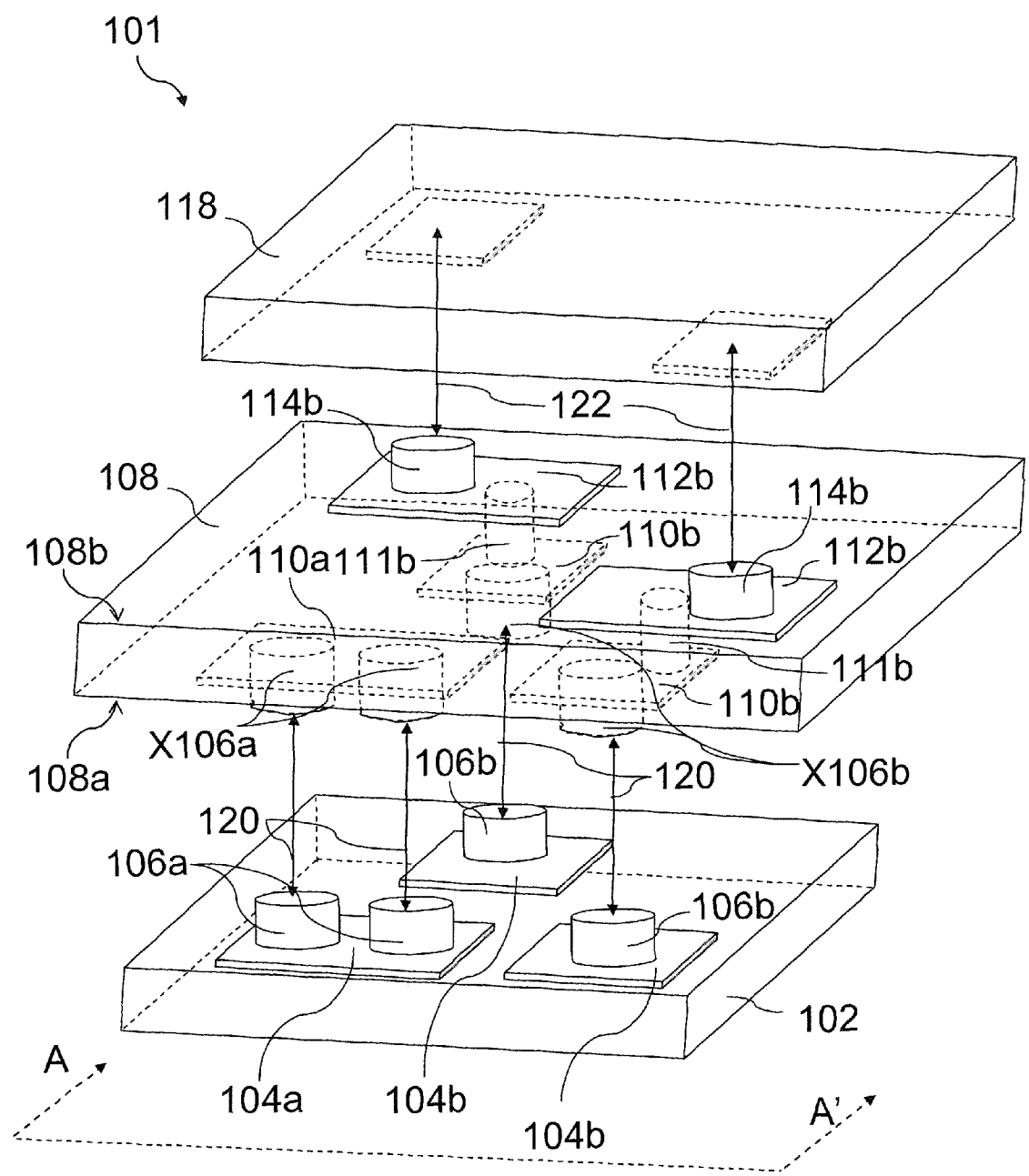

FIG. 1B shows a perspective view 101 of a small segment of the conventional chip arrangement shown in FIG. 1A further including a plurality of exposed bumps X106a, X106b formed on the plurality of traces 110a, 110b.

As shown in FIG. 1B, the exposed bumps X106a, X106b may be formed on the plurality of traces 110a, 110b. In one or more embodiments, the exposed bumps X106a, X106b may include, or may be, posts that may be formed on a landing pad. In one or more embodiments, the exposed bumps X106a, X106b may include, or may be, stacks (e.g. metal or metal alloy stacks, e.g. Ni—Pd—Au stacks). In one or more embodiments, the exposed bumps X106a, X106b may include, or may be, pillars (e.g. metal or metal alloy pillars, e.g. copper pillars).

Figures 1, 1C:
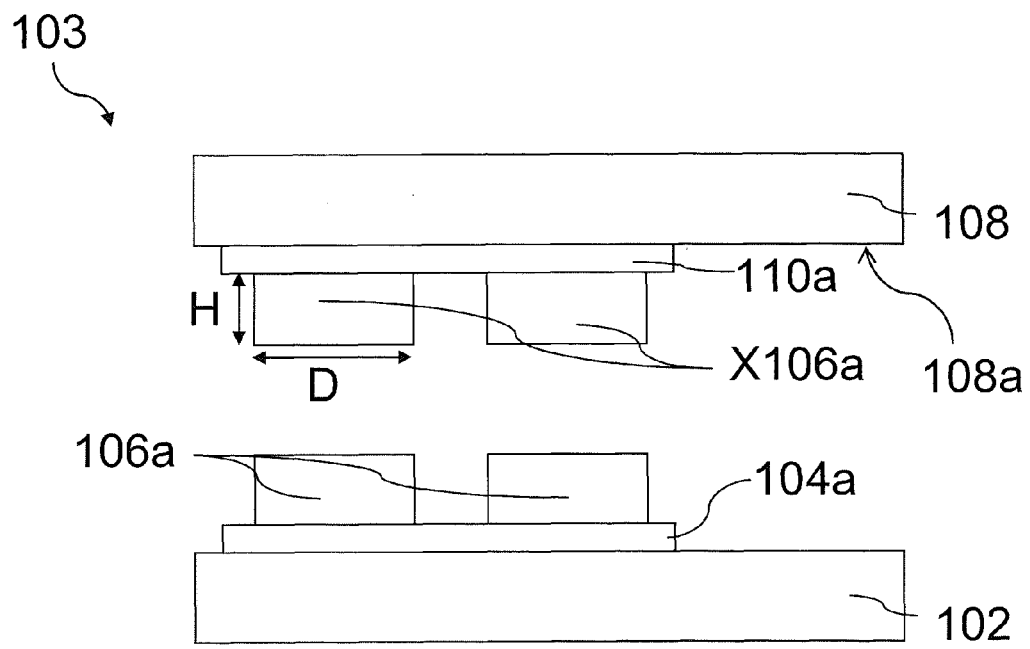
Figures 1, 1C, 2:
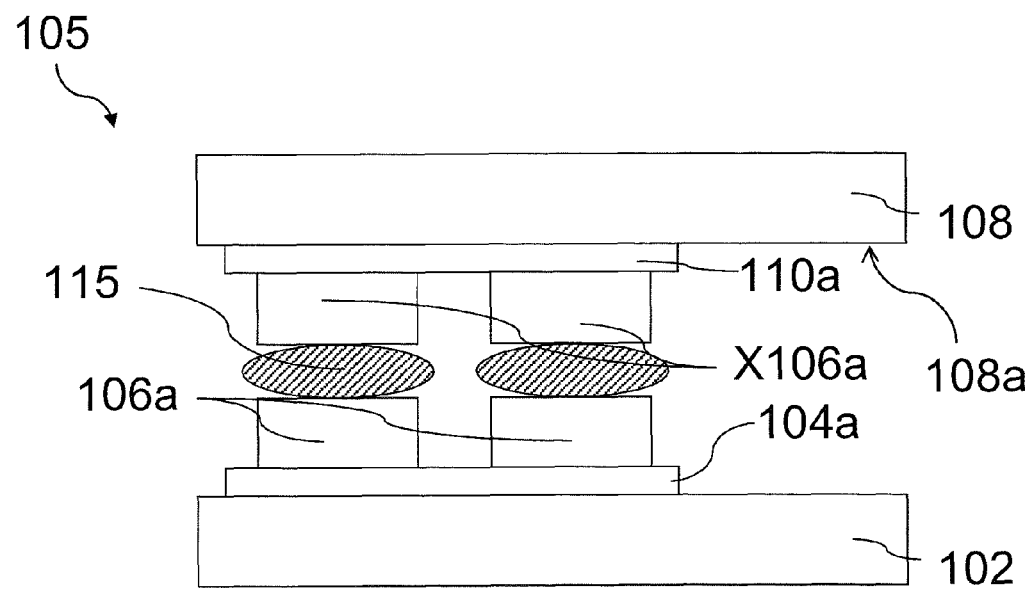
FIG. 2 show a cross-sectional view of a chip arrangement according to various embodiments.

FIG. 1C-1 and FIG. 1C-2 shows cross-sectional views of the conductive interconnects 106a and the exposed bumps X106a of the conventional chip arrangement shown in FIG. 1B along the line A-A'.

The exposed bumps X106a may have a low profile. For example, the exposed bumps X106a (e.g. Ni—Pd—Au stacks) may have a lateral extent (e.g. a diameter D) that may be larger than a height H measured a direction perpendicular to the surface 108a of the chip-external connection region 108. A ratio of the diameter D to the height H (i.e. D:H) of the exposed bumps X106a (e.g. Ni—Pd—Au stacks) may be greater than or equal to about 3, for example greater than or equal to about 4, for example greater than or equal to about 5.

The exposed bumps X106a may have a medium to a high profile. For example, the exposed bumps X106a (e.g. copper pillars) may have a lateral extent (e.g. a diameter D) that may be smaller than a height H measured a direction perpendicular to the surface 108a of the chip-external connection region 108. A ratio of the height H to the diameter D (i.e. H:D) of the exposed bumps X106a (e.g. copper pillars) may be greater than or equal to about 1.5, for example greater than or equal to about 2, for example greater than or equal to about 3.

As shown in FIG. 1C-1, the interconnection between the chip 102 and the chip-external connection region 108 may be made by placing the chip-external connection region 108 over the chip 102 (or vice versa), e.g. by means of an assembly process. To cover the tolerances for placement during the assembly of the chip 102 and the chip-external connection region 108, the diameter D of at least one exposed bump X106a may be greater than or equal to about 20 µm, for example greater than or equal to about 30 µm, for example in the range from about 30 µm to about 40 µm. Accordingly, the above-mentioned ratios of the height H to the diameter D of the exposed bumps X106a may be based on a diameter D of at least one exposed bump X106a being greater than or equal to about 20 µm (e.g. in the range from about 30 µm to about 40 µm).

As shown in FIG. 1C-2, an optional conductive interconnect 115 may be dispensed on the exposed bumps X106a and/or on the conductive interconnects 106a during an assembly process so as to form the interconnection between the chip 102 and the chip-external connection region 108.

The optional conductive interconnect 115 may include, or may consist of, a metal or metal alloy. For example, the optional conductive interconnect 115 may include, or may consist of, an Sn—Ag alloy (e.g. solder)

As shown in FIG. 1C-1 and FIG. 1C-2, the dimensions (e.g. diameter D and/or height H) and/or a shape of the exposed bumps X106a may be substantially the same as dimensions and/or a shape of the conductive interconnect 106a. In other words, the exposed bumps X106a formed at chip-external connection region 108 may have a shape (e.g. same shape) that may be complementary to the conductive interconnects 106a. In other embodiments, the dimensions (e.g. diameter D and/or height H) and/or a shape of the exposed bumps X106a may be different from dimensions and/or a shape of the conductive interconnect 106a. Such examples are shown in FIG. 1D and FIG. 1E.

Figure 1D:
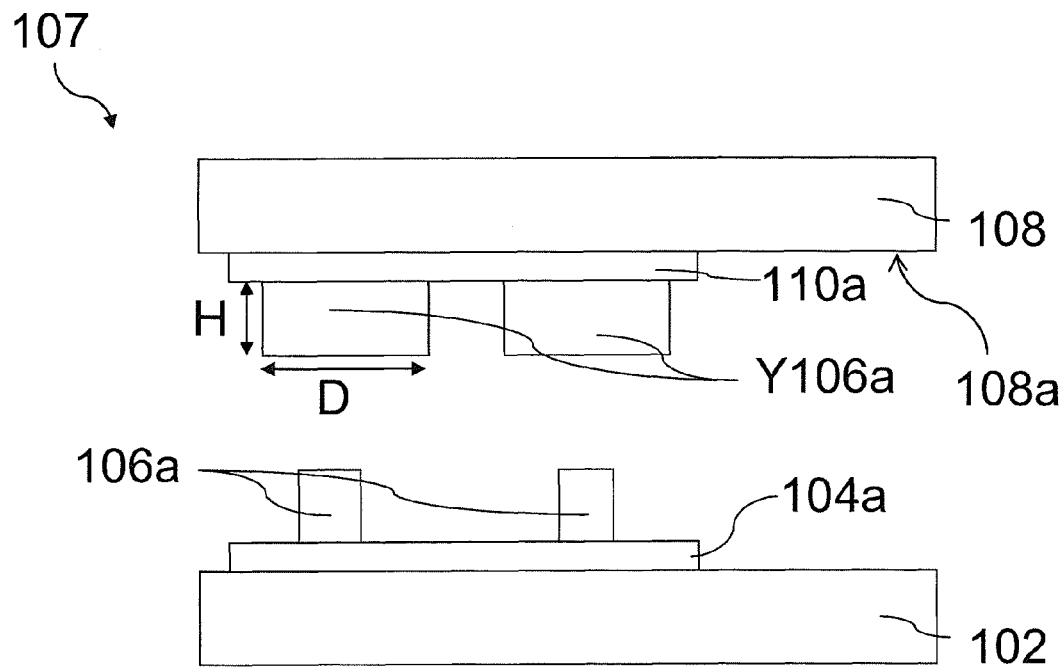
Figure 1E:
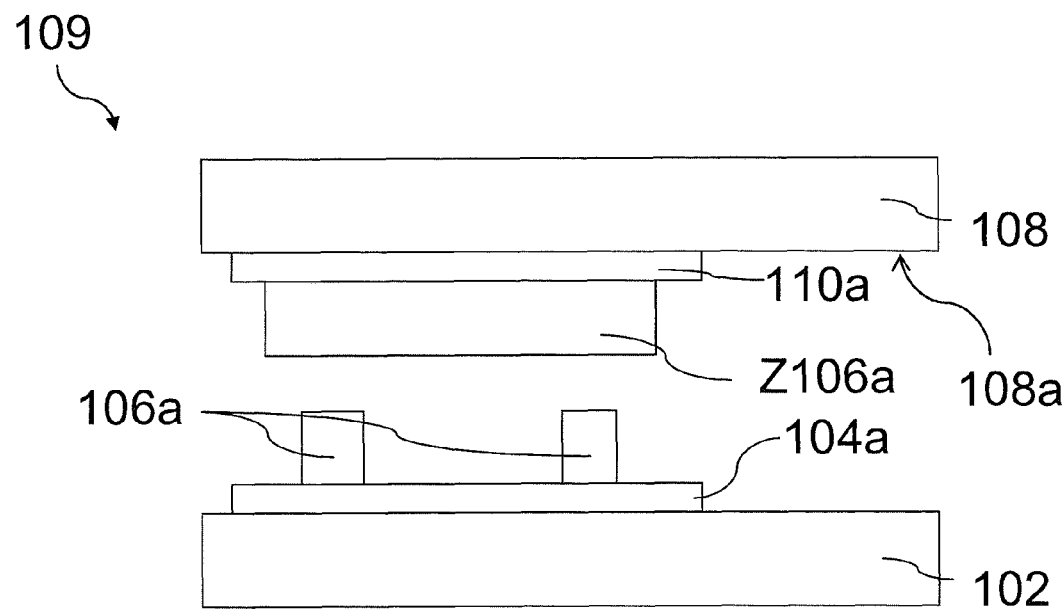
Figure 2:
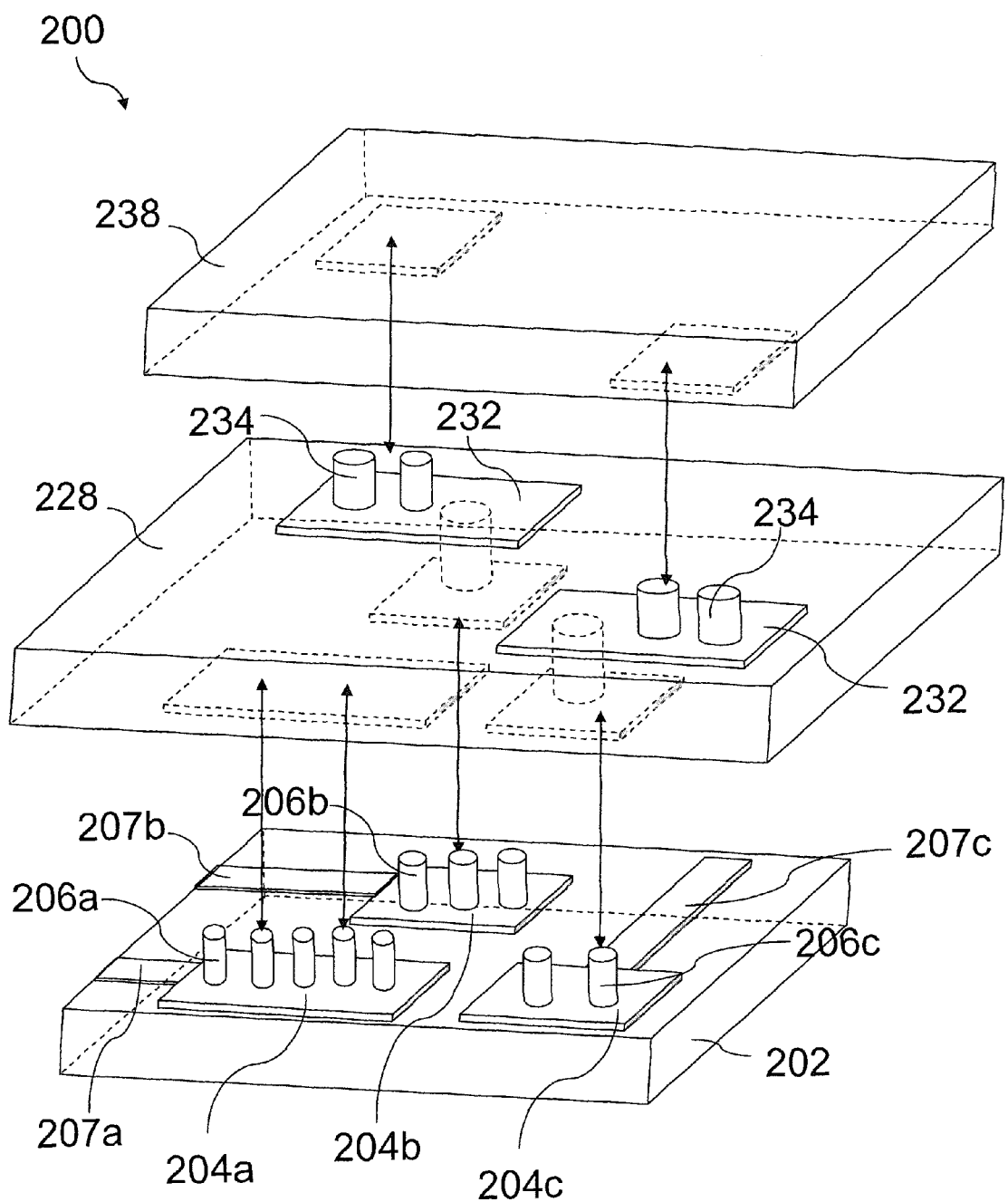

FIG. 1D shows a cross-sectional view 107 of the conductive interconnects 106a and the exposed bumps Y106a.

As shown in FIG. 1D, the exposed bumps Y106a may be formed with a larger shape that may be complementary to the conductive interconnects 106a. This may, for example, be formed as a copper pillar.

In one or more embodiments, the conductive interconnects 106a may contact a single exposed bump. Such an example is shown in FIG. 1E.

FIG. 1E shows a cross-sectional view 109 of the conductive interconnects 106a and one exposed bump Z106a.

As shown in FIG. 1E, the exposed bump Z106a may be formed with a different shape over an area that may overlap the conductive interconnects 106a. In this example, the conductive interconnects 106a contact one exposed bump Z106a. The exposed bump Z106a may have a low profile e.g. with a low profile Ni—Pd—Au bump.

FIG. 2 shows a cross-sectional view 200 of a part of a chip arrangement according to various embodiments.

As shown in FIG. 2, a chip arrangement according to various embodiments may include: a chip 202 including a plurality of electrical nets 207a, 207b, 207c, wherein each electrical net comprises at least one bonding pad 204a, 204b, 204c. For example, in the chip arrangement shown in FIG. 2, the bonding pad 204a may be part of the electrical net 207a; the bonding pad 204b may be part of the electrical net 207b; and the bonding pad 204c may be part of the electrical net 207c. The chip arrangement may include a plurality of pillars 206a, 206b, 206c formed on the at least one bonding pad 204a, 204b, 204c of a majority of the plurality of electrical nets 207a, 207b, 207c. For example, in the chip arrangement shown in FIG. 2, the plurality of pillars are formed on the at least one bonding pad of all the electrical nets the 207a, 207b, 207c. In another embodiment, the plurality of pillars may be formed on the at least one bonding pad of at least half of the electrical nets of the plurality of electrical nets the 207a, 207b, 207c. The plurality of pillars 206a, 206b, 206c may be configured to connect the at least one bonding pad 204 of the chip 202 to a chip-external connection region 228.

In one or more embodiments, a design of the at least one bonding pad 204a, 204b, 204c of the chip 202 and a design of at least one pillar of the plurality of pillars 206a, 206b, 206c formed on the at least one bonding pad 204a, 204b, 204c of the chip 202 may improve reliability of a connection between the chip 202 and the chip-external connection region 228.

As shown in FIG. 2, a chip arrangement according to various embodiments may include: a chip-external connection region 228 including at least one trace 232, and a plurality of conductive interconnects 234 formed on the at least one trace 232. The plurality of conductive interconnects 234 may be configured to connect the chip-external connection region 228 to another connection region 238.

In one or more embodiments, a design of the at least one trace 232 of a chip-external connection region 228 and a design of at least one conductive interconnect of the plurality of conductive interconnects 234 formed on the at least one trace 232 may improve reliability of a connection between the chip-external connection region 228 and the other connection region 238.

An effect of one or more embodiments may be reduction in breakage of a connection between a chip and a chip-external connection region and/or a connection between a chip-external connection region and another connection region.

An effect of one or more embodiments may be at least one elastic pillar.

An effect of one or more embodiments may be reduction in stress and/or strain in at least one pillar.

An effect of one or more embodiments may be reduction in bonding pad pitch.

An effect of one or more embodiments may be an increase in bonding pad density.

An effect of one or more embodiments may be distribution of force within at least one pillar.

Figure 3A:
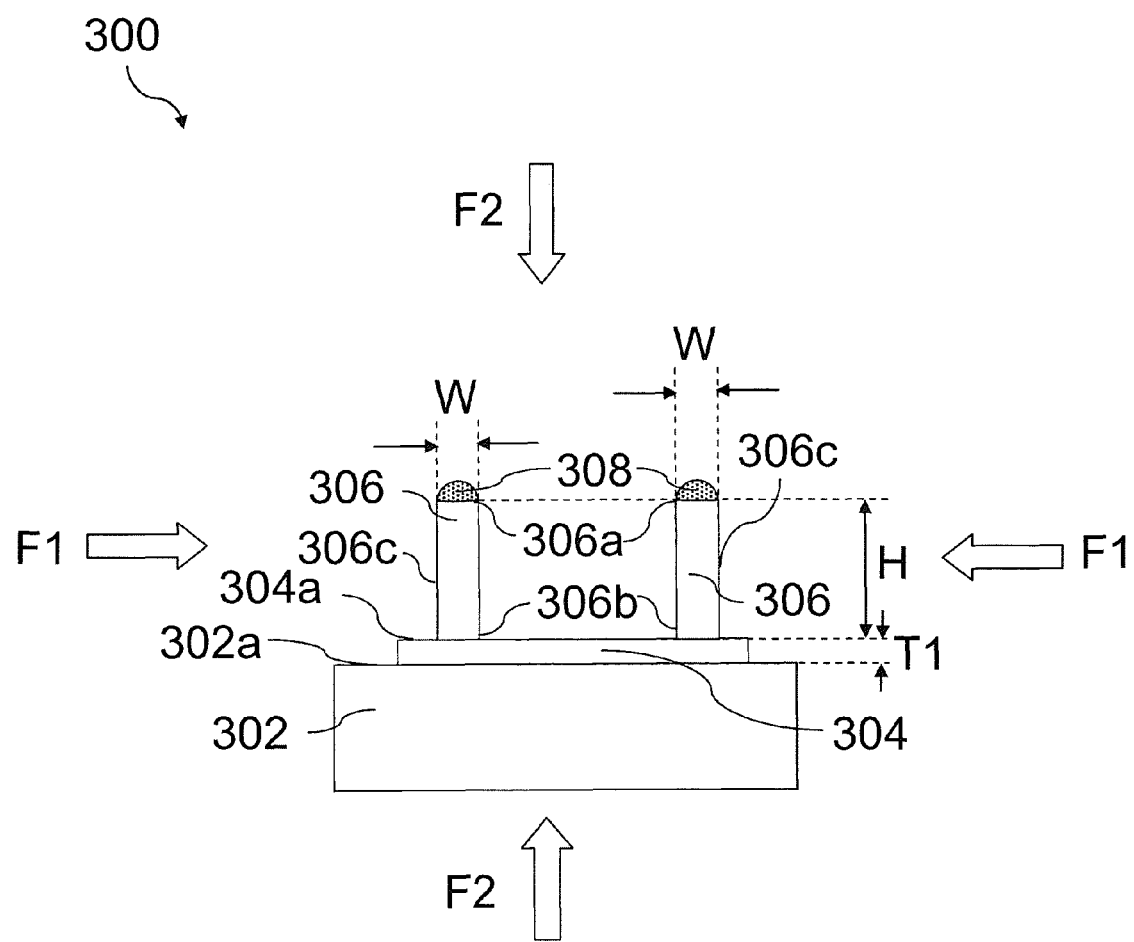
FIG. 3A to FIG. 3C show cross-sectional views of chip arrangements according to various embodiments.
Figure 3B:
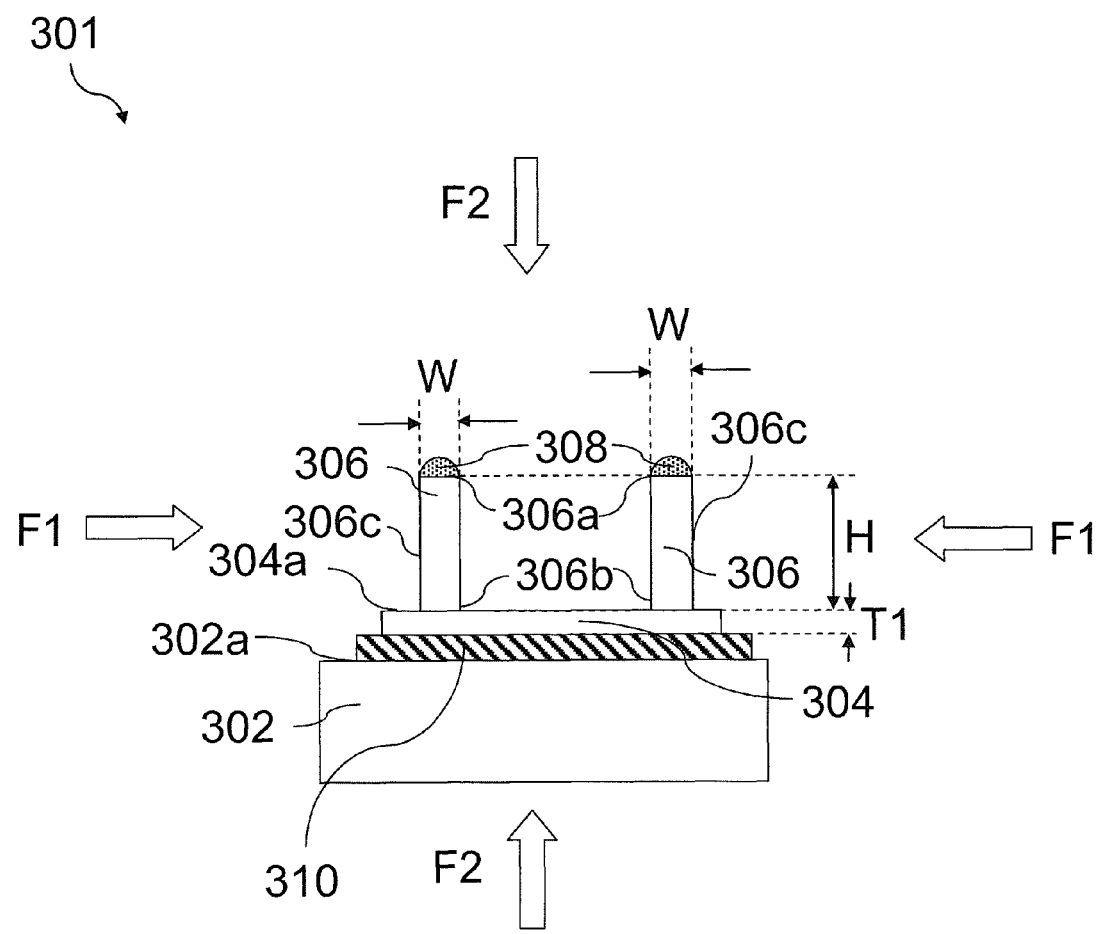
Figure 3C:
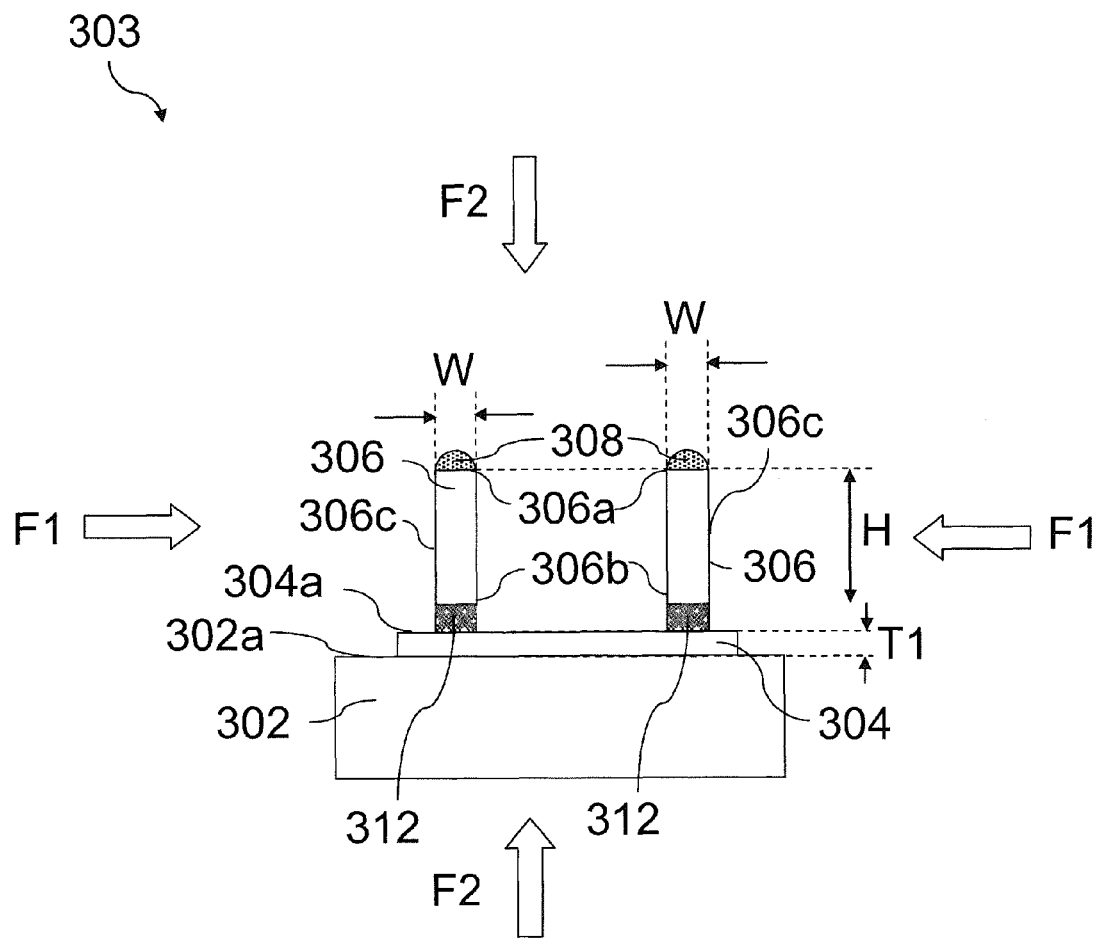

FIG. 3A to FIG. 3C show cross-sectional views of chip arrangements according to various embodiments.

As shown in FIG. 3A in a view 300, a chip arrangement may include a chip 302 including at least one bonding pad 304, and a plurality of pillars 306 formed on the at least one bonding pad 304.

The chip 302 shown in FIG. 3A may, for example, be identified with the chip 202 shown in FIG. 2. In like manner, the at least one bonding pad 304 shown in FIG. 3A may, for example, be identified with one or more of the at least one bonding pad 204a, 204b, 204c shown in FIG. 2. Similarly, the plurality of pillars 306 shown in FIG. 3A may, for example, be identified with the one or more of the plurality of pillars 206a, 206b, 206c shown in FIG. 2.

In one or more embodiments, the at least one bonding pad 304 may, for example, be a plane area at which an electrical and/or mechanical interconnect (e.g. the plurality of pillars 306) may be formed. In one or more embodiments, a surface 304a of the at least one bonding pad 304 may include, or may consist of, a conductive material (e.g copper, aluminum, silver).

Only one bonding pad 304 is shown as an example, however the number of bonding pads may be greater than one, and may, for example, be two, three, four, five, six, seven, eight, nine, or on the order of tens, hundreds, thousands of, or even more bonding pads in some embodiments. Only two pillars 306 are shown as an example, however the number of pillars may be greater than two and may, for example, be three, four, five, six, seven, eight, nine, or on the order of tens, hundreds of, or even more, pillars in some embodiments.

In one or more embodiments, the chip 302 may include, or may be, at least one of a memory chip, a logic chip (e.g. a hardwired logic chip and/or a programmable logic chip, such as, for example, a micro-controller, a micro-processor, a field programmable gate array (FPGA)), a chip having a high current capacity (e.g. a chip for power management applications), and a chip for use in a system-on-chip (SoC) application, although other chips may be possible as well in accordance with other embodiments. In one or more embodiments, the chip 302 may be a chip with a high pin count, e.g. a pin count of about 30 pins to about 3000 pins.

In one or more embodiments, the chip 302 may have a plurality of electrical nets. The number of electrical nets of the chip 302 may, for example, be greater than or equal to about 20, for example, greater than or equal to about 25, for example, greater than or equal to about 35, etc.

In one or more embodiments, the chip 302 may include a semiconductor material such as, for example, silicon, although other semiconductor materials, including compound semiconductor materials, may be possible as well. In accordance with an embodiment, the semiconductor material may be selected from a group of materials, the group consisting of: silicon, germanium, gallium nitride, gallium arsenide, and silicon carbide, although other materials may be possible as well in accordance with other embodiments.

In one or more embodiments, the chip 302 may include a doped semiconductor material, such as, for example, a doped silicon material, a doped germanium material, a doped gallium nitride material, a doped gallium arsenide material, or a doped silicon carbide material, although other doped semiconductor materials may be possible as well in accordance with other embodiments.

In this connection, the term "doped semiconductor material" may include a case where the entire semiconductor material of the chip 302 is doped, as well as a case where only a part (for example, an upper part) of the semiconductor material of the chip 302 is doped. The semiconductor material of the chip 302 may be a p-doped substrate (in other words, a semiconductor material doped with a p-type dopant) or an n-doped substrate (in other words, a semiconductor material doped with an n-type dopant). In accordance with an embodiment, the dopants for doping the semiconductor material of the chip 302 may include, or may consist of, at least one material selected from a group of materials, the group consisting of: boron, aluminium, gallium, indium, antimony, phosphorus, arsenic, and antimony, although other materials may be possible as well in accordance with other embodiments. By way of an example, the semiconductor material of the chip 302 may be silicon doped with a p-type dopant such as boron. By way of another example, the semiconductor material of the chip 302 may be silicon doped with an n-type dopant such as phosphorous, arsenic or antimony.

In one or more embodiments, the chip 302 may include a dielectric material. In accordance with an embodiment, the dielectric material may include at least one material selected from a group of materials, the group consisting of: an oxide, a nitride and an oxynitride, although other materials may be possible as well in accordance with other embodiments. For example, the chip 302 may include, or may consist of, silicon dioxide ($SiO_2$) and/or silicon nitride ($Si_3N_4$) and/or further (i.e. other) low K materials.

As described above, the chip 302 may include at least one bonding pad 304. In one or more embodiments, the at least one bonding pad 304 may be formed on a surface 302a of the chip 302.

In accordance with an embodiment, the surface 302a on which the at least one bonding pad 304 is formed may be an active surface of the chip 302. In accordance with another embodiment, the surface 302a on which the at least one bonding pad 304 is formed may be a passive surface of the chip 302, e.g. a surface of the chip 302 facing away from (e.g. opposite) an active surface of the chip 302.

In one or more embodiments, the at least one bonding pad 304 may be formed on the surface 302a of the chip 302 by means of a deposition process such as, for example, at least one of a plating process (e.g. a galvanic, electrochemical or electroless plating process), a chemical vapor deposition (CVD) process, a low-pressure CVD (LPCVD) process, a plasma-enhanced chemical vapor deposition (PECVD) process, a high-density plasma chemical vapor deposition (HDP-CVD) process, a physical vapor deposition (PVD) process, and a sputtering process, or other suitable deposition processes.

In one or more embodiments, the deposition process may be performed in conjunction with a patterned deposition mask, which may be formed over a part of the surface 302a of the chip 302. In accordance with an embodiment, the patterned deposition mask may be formed by depositing a masking material over the surface 302a of the chip 302, and patterning the masking material to form the patterned deposition mask. In one or more embodiments, patterning the masking material may include, or may consist of, a lithographic process (e.g. a photo-lithographic process.) In one or more embodiments, the patterned deposition mask may be removed after forming the at least one bonding pad 304.

In one or more embodiments, the surface 302a of the chip 302 may be configured to face a chip-external connection region (e.g. the chip-external connection region 228 shown in FIG. 2). In one or more embodiments, the chip-external connection region may be a bonding region (e.g. a bonding pad) on another chip (e.g. in a chip face-to-face interconnect). In one or more embodiments, the chip-external connection region may include, or may be, a carrier, for example, in at least one of a flip-chip package, a wire-bonded chip package, and a 2.5D interposer package. In other words, the chip-external connection region 108 may include, or may be, a package for the chip 102. By way of an example, the chip-external connection region may include, or may be, at least one of a silicon, glass, or organic carrier. In one or more embodiments, the chip-external connection region may include, or may be, a landing pad (e.g. a landing pad having larger dimensions than the at least one bonding pad 304) formed on a carrier (e.g. a carrier in a flip chip package). In one or more embodiments, the chip-external connection region may include, or may be, a trace (e.g. a metal trace such as e.g. a copper trace or an aluminum trace) formed on a substrate (e.g. a silicon substrate), for example, a trace formed on a substrate of a package (e.g. a chip package).

In one or more embodiments, the at least one bonding pad 304 may include, or may be, an input/output (I/O) pad (e.g. a pad configured to receive one or more input/output signals. In other words, the plurality of electrical nets may include an input and/or output net (e.g. a net configured to receive one or more input/output signals). The input/output signal may have various characteristics. For example, the signal may have a fixed value for current and/or voltage. By way of another example, the signal may have an alternating electrical characteristic with a widely different parameters like applicable frequency bandwidth, usually called AC (RF) or digital signals. The at least one bonding pad 304 may include, or may be, other types of pads (e.g. power supply pads, for example a pad configured to receive power supply potential). In other words, the plurality of electrical nets may include a supply net (e.g. a net configured to receive and/or provide one or more power supply potentials). In one or more embodiments, the at least one bonding pad 304 may be a bonding pad of an input/output signal network of a chip (e.g. a chip used in a system on chip (SoC) application, or the like).

In one or more embodiments, the chip 302 may have enhanced functionality (e.g. a chip for power management applications), and may include multiple (i.e. a plurality of) I/O pads and/or multiple (i.e. a plurality of) signal networks. In one or more embodiments, the at least one bonding pad 304 may be part of a signal network of the plurality of signal networks (e.g. in a chip having enhanced functionality).

In one or more embodiments, the at least one bonding pad 304 may include, or may be, a signal line formed on the surface 302a of the chip 302. For example, in one or more embodiments, the at least one bonding pad 304 may include, or may be, at least one of an input/output (I/O) signal line formed on the surface 302a of the chip 302, although other types of signal lines (e.g. a test signal line, a power supply line, a ground line) may be possible as well in accordance with other embodiments.

In one or more embodiments, the at least one bonding pad 304 may include, or may consist of, a metal or metal alloy. In one or more embodiments, the metal may include at least one metal selected from a group of metals, the group consisting of: copper, aluminium, gold, silver, palladium, and platinum, or an alloy containing at least one of the aforementioned metals.

In one or more embodiments, a thickness T1 of the at least one bonding pad 304 may be greater than or equal to about 3 µm, for example in the range from about 3 µm to about 20 µm, for example in the range from about 3 µm to about 20 µm, for example in the range from about 3 µm to about 15 µm, for example in the range from about 3 µm to about 8 µm although other values may be possible as well in accordance with other embodiments.

In one or more embodiments, the chip arrangement may include a plurality of pillars 306 formed on the at least one bonding pad 304.

An effect of forming the plurality of pillars 306 on the at least one bonding pad 304 may be a distribution of at least one of a lateral force F1 and a compressive force F2 over the plurality of pillars 306 such that each pillar of the plurality of pillars 306 may experience a fraction of (e.g. a part of) at least one of the lateral force F1 and the compressive force F2. Therefore, an effect of one or more embodiments may be reduction in breakage of an interconnection between the chip 302 and a chip-external connection region (e.g. a bonding pad of another chip and/or a pad on a carrier, for example a carrier in a package). An effect of one or more embodiments may be increased reliability in an interconnection between the chip 302 and a chip-external connection region (e.g. a bonding pad of another chip and/or a trace on a substrate). The smaller contact area for each individual pillar may be also an advantage to reduce the risk of encapsulation of further material like a pre-dispensed underfill at the contact area, as the distance from the center of the pillar to the edge may be automatically reduced with a thinner bump diameter. Such a material (e.g. pre-dispensed underfill) may be used for a thermo compression bonding on fine pitch copper pillars with diameters e.g. below 50-60 µm.

In one or more embodiments, the plurality of pillars 306 may be formed by means of a deposition process such as, for example, at least one of a plating process, a chemical vapor deposition (CVD) process, a low-pressure CVD (LPCVD) process, a plasma-enhanced chemical vapor deposition (PECVD) process, a high-density plasma chemical vapor deposition (HDP-CVD) process, a physical vapor deposition (PVD) process, ultrasonic bonding, metal dust deposition and a sputtering process, or other suitable deposition processes, which may be known as such in the art.

In one or more embodiments, the deposition process may be performed in conjunction with a patterned deposition mask, which may be formed over at least a part of the surface 304a of the at least one bonding pad 304 facing away from the chip 302. In accordance with an embodiment, the patterned deposition mask may be formed by depositing a masking material over the surface 304a of the at least one bonding pad 304 facing away from the chip 302 and over the surface 302a of the chip 302, and patterning the masking material to form the patterned deposition mask. In one or more embodiments, patterning the masking material may include, or may consist of, a lithographic process (e.g. a photo-lithographic process.) In one or more embodiments, the patterned deposition mask may be removed after forming the at least one pillar 306.

In one or more embodiments, the plurality of pillars 306 may include, or may consist of a metal or metal alloy. In one or more embodiments, the metal may include at least one metal selected from a group of metals, the group consisting of: copper, aluminium, gold, silver, palladium, and platinum, or an alloy containing at least one of the aforementioned metals.

In one or more embodiments, the plurality of pillars 306 may be configured to connect the at least one bonding pad 306 to a chip-external connection region. For example, the plurality of pillars 306 may be configured to connect the at least one bonding pad 306 to a bonding region (e.g. a bonding pad) of another chip. By way of another example, the plurality of pillars 306 may be configured to connect the at least one bonding pad 306 to a trace (e.g. a copper trace) formed on a substrate (e.g. a silicon substrate), for example, a trace formed on a substrate of a package (e.g. a flip chip package).

In accordance with an embodiment, the plurality of pillars 306 may, for example, have the shape of a cylindrical pillar, other shapes like a oval pillar (e.g. shaped like drops), a rectangular pillar (e.g. with rounded corners), a tower, a pyramid, or a truncated cone, although other shapes may be possible as well in accordance with other embodiments.

In accordance with an embodiment, a cross-section of the at least one pillar 306 may, for example, have a circular shape, a rectangular shape, a triangular shape, an oval shape, a quadratic shape, a polygonal shape, or an irregular shape, although other shapes may be possible as well in accordance with other embodiments.

In accordance with an embodiment, a height H of a pillar of the plurality of pillars 306 may be measured in a direction perpendicular to the surface 302a of the chip 302 (as shown in FIG. 3A). In one or more embodiments, the height H may be measured from an apex 306a to a base 306b of the pillar of the plurality of pillars 306 (as shown in FIG. 3A).

In one or more embodiments, the height H of a pillar of the plurality of pillars 306 may be greater than or equal to about 10 μm, for example greater than or equal to about 20 μm, for example greater than or equal to about 30 μm, for example greater than or equal to about 40 μm, for example in the range from about 40 μm to about 100 μm, for example in the range from about 40 μm to about 80 μm, for example in the range from about 40 μm to about 60 μm, for example about 50 μm, although other values may be possible as well in accordance with other embodiments.

Figure 9:
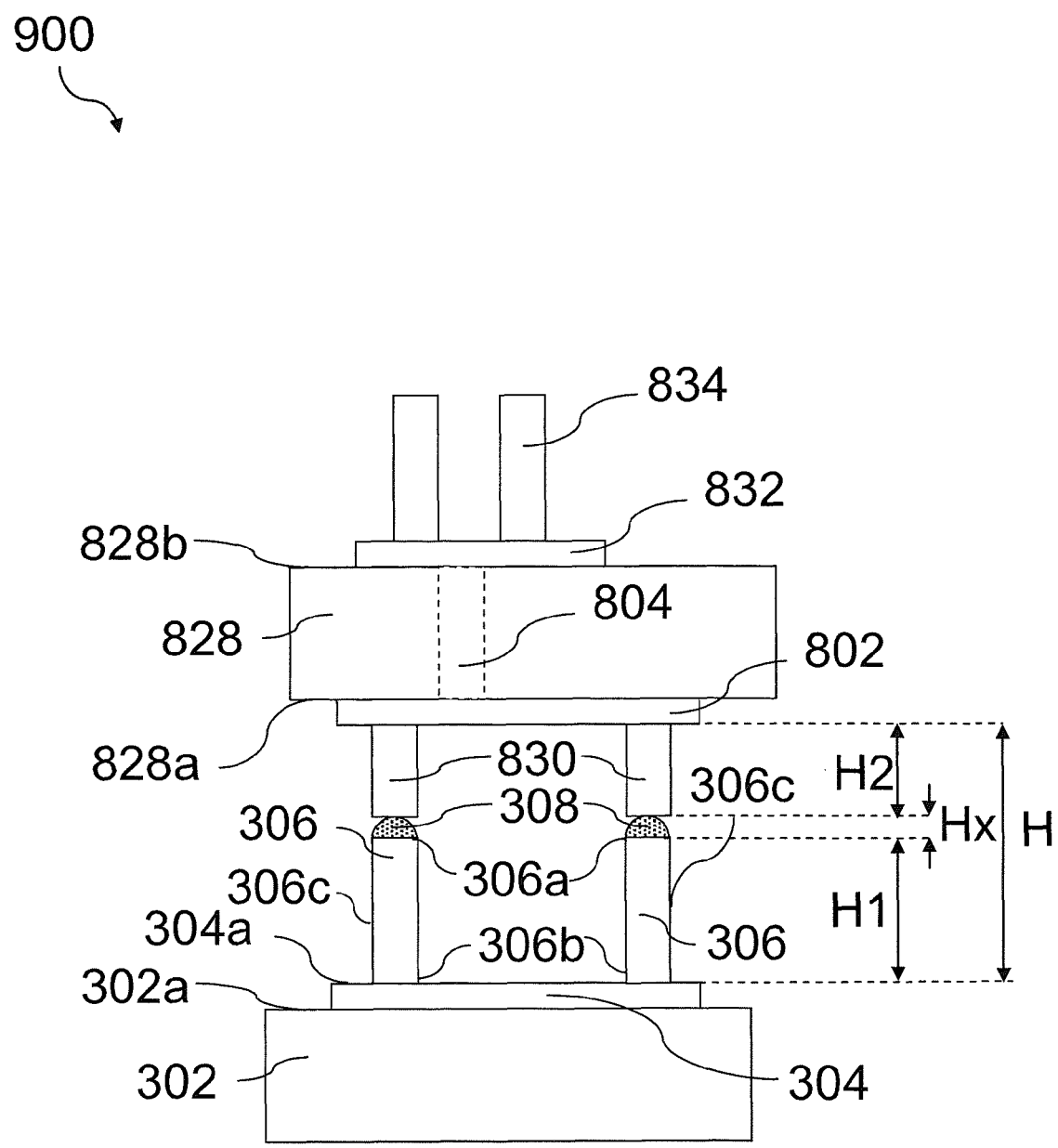
FIG. 9 shows a cross-sectional view of a chip arrangement including a chip-external connection region according to various embodiments.

The height H of a pillar of the plurality of pillars 306 may refer to an effective height of an interconnection between the chip 302 and a chip-external connection region. For example, the effective height H may be the sum of the height H1 of a pillar formed on the chip 302 and the height H2 of an interconnect (e.g. pillar) formed on the chip external connection region. For example, H=H1+H2. In other words, the effective height H of a pillar of the plurality of pillars 306 may be reached or extended by the introduction of an interconnect (e.g. pillar) on a landing pad (e.g. exposed landing pad) on the chip external connection region. In some examples, the effective height of the pillar formed on the chip 302 may include a height Hx of an interconnect (e.g. solder joint) that may, for example, be disposed between the pillar formed on the chip 302 and the an interconnect (e.g. pillar) formed on the chip external connection region. For example, H=H1+H1+Hx. An example of this is given in the description below, e.g. in respect of FIG. 9.

In an embodiment where the height H of a pillar of the plurality of pillars 306 may refer to an effective height of an interconnection between the chip 302 and a chip-external connection region, a scaling of the diameters the pillar and the interconnection (e.g. pillars, e.g. copper pillars) and/or the placement accuracy during the assembly of the chip 302 and the chip-external connection region may need to be taken into account. For example, the diameter of the the pillar formed on the chip 302 may be wider than the diameter of the interconnect (e.g. pillar) formed on the chip external connection region, or vice versa. In such an example, the wider diameter of an interconnect (e.g. pillar formed on the chip 302 or interconnect formed on the chip external connection region) may cover a margin of tolerances that may efficiently allow placement accuracy, while the other interconnect (e.g. pillar formed on the chip 302 or interconnect formed on the chip external connection region) may have a narrower diameter that may provide elasticity to the other interconnect.

In accordance with an embodiment, a width W of a pillar of the plurality of pillars 306 may be measured as a widest lateral extent of the plurality of pillars 306 in a direction perpendicular to the height H (as shown in FIG. 3A). In one or more embodiments, the width W of a pillar of the plurality of pillars 306 may refer to the width of a widest part of the pillar of the plurality of pillars 306 (as shown in FIG. 3A).

In one or more embodiments, the width W of a pillar of the plurality of pillars 306 may be in the range from about 5 μm to about 25 μm, for example in the range from about 8 μm to about 25 μm, for example in the range from about 10 μm to about 25 μm, for example in the range from about 12 μm to about 22 μm, for example in the range from about 12 μm to about 20 μm, for example in the range from about 12 μm to about 18 μm, for example in the range from about 12 μm to about 17 μm, for example about 15 μm, although other values may be possible as well in accordance with other embodiments.

An effect of the width W being in the range from about 5 μm to about 25 μm may be a more smaller contact area between the plurality of pillars 306 and a chip-external connection region (e.g. a bonding pad of another chip and/or trace on a substrate and/or a pad on a carrier). Therefore, an effect of one or more embodiments may be more accurate placement of the chip 302 on a chip-external connection region (e.g. a bonding pad of another chip and/or a trace on a substrate and/or a pad on a package).

In one or more embodiments, an aspect ratio of a pillar of the plurality of pillars 306 may be calculated as a ratio of the height H to the width W of the pillar, in other words H:W. In accordance with an embodiment, the aspect ratio (H:W) of a pillar of the plurality of pillars 306 may be greater than or equal to about 2, for example greater than or equal to about 2.5, for example greater than or equal to about 3, for example, greater than or equal to about 5, although other values may be possible as well in accordance with other embodiments.

In accordance with an embodiment, an effect of the aspect ratio being greater than or equal to about 2 may be a flexible pillar (e.g. a copper pillar). In other words, the plurality of pillars may resume their original shape and/or position after being subjected to a force, for example a lateral force F1 exerted on at least one sidewall 306c of the plurality of pillars 306. Therefore, an effect of one or more embodiments may be an elastic plurality of pillars. An effect of one or more embodiments may be reduction in breakage of a connection between the chip 302 and a chip-external connection region (e.g. a bonding pad of another chip and/or a trace on a substrate and/or a pad on a package). An effect of one or more embodiments may be increased reliability in a connection between the chip 302 and a chip-external connection region (e.g. a bonding pad of another chip and/or a trace on a substrate and/or a pad on a package).

In one or more embodiments, a ratio of the thickness T1 of the at least one bonding pad 306 to the width W of a pillar of the plurality of pillars 306, in other words T1:W, may be greater than or equal to about 0.2, for example greater than or equal to about 0.3, for example greater than or equal to about 0.5, for example greater than or equal to about 0.6, for example greater than or equal to about 0.8, for example greater than or equal to about 0.9, for example in the range from about 0.9 to about 3, for in the range from about 0.9 to about 2.8, for example in the range from about 0.9 to about 2.5, for example in the range from about 0.9 to about 2, for example about 1.5, although other values may be possible as well in accordance with other embodiments.

An effect of the ratio of the thickness T1 of the at least one bonding pad 306 to the width W of a pillar of the plurality of pillars 306 being greater than or equal to about 0.2 may be a bonding pad 306 that may act as a cushion for the pillar of the plurality of pillars 306. In other words, the at least one bonding pad 306 may absorb a compressive force F2 exerted on the plurality of pillars 306. In one or more embodiments, the compressive force F2 may be exerted on an apex 306a of the plurality of pillars 306. In one or more embodiments, the compressive force F2 may be exterted on a base 306b of the plurality of pillars 306. An effect of one or more embodiments may be reduction in stress and/or strain in the plurality of pillars 306. An effect of one or more embodiments may be reduction in breakage of a connection between the chip 302 and a chip-external connection region (e.g. a bonding pad of another chip and/or a trace on a substrate). An effect of one or more embodiments may be increased reliability in a connection between the chip 302 and a chip-external connection region (e.g. a bonding pad of another chip and/or a trace on a substrate).

In one or more embodiments, the chip arrangement may include a bonding material 308 formed on the plurality of pillars 306. In one or more embodiments, the bonding material 308 may be configured to be interposed between the plurality of pillars 306 and the chip-external connection region (e.g. a bonding pad of another chip and/or a trace on a substrate and/or a pad on a carrier). In other embodiments, the bonding material 308 may be placed on the chip-external connection region (e.g. a bonding pad of another chip and/or a trace on a substrate and/or a pad on a carrier), and may not be included in the chip arrangement shown in FIG. 3A.

In one or more embodiments, the bonding material 308 may be formed on the plurality of pillars 306 and/or on the chip-external connection region by means of at least one of a therm-compression process, a diffusion soldering process, a printing process, or other suitable processes.

In one or more embodiments, a diameter of the bonding material 308 may be at least substantially equal to the width W of a pillar of the plurality of pillars 306.

In one or more embodiments, the bonding material 308 may include, or may consist of at least one material selected from a group of materials, the group consisting of: bismuth, copper, antimony, indium, tin, gold, silver and zinc, although other materials may be possible as well in accordance with other embodiments.

FIG. 3B shows a cross-sectional view of a chip arrangement according to various embodiments.

As shown in FIG. 3B in a view 301, the chip 302 may include a chip liner 310 formed on at least a part of the surface 302a of the chip 302. In one or more embodiments, the chip liner 310 may be interposed between the chip 302 and the at least one bonding pad 304 (as shown in FIG. 3B). In such an embodiment, forming the at least one bonding pad 304 on the surface 302a of the chip 302 may include forming the at least one bonding pad 304 on the chip liner 310.

In one or more embodiments, the chip liner 310 may be formed by means of a deposition process such as, for example, at least one of a plating process, a chemical vapor deposition (CVD) process, a low-pressure CVD (LPCVD) process, a plasma-enhanced chemical vapor deposition (PECVD) process, a high-density plasma chemical vapor deposition (HDP-CVD) process, a physical vapor deposition (PVD) process, and a sputtering process, or other suitable deposition processes.

In one or more embodiments, the deposition process may be performed in conjunction with a patterned deposition mask, which may be formed over a part of the surface 302a of the chip 302. In accordance with an embodiment, the patterned deposition mask may be formed by depositing a masking material over the surface 302a of the chip 302, and patterning the masking material to form the patterned deposition mask. In one or more embodiments, patterning the masking material may include, or may consist of, a lithographic process (e.g. a photo-lithographic process.) In one or more embodiments, the patterned deposition mask may be removed after forming the chip liner 310.

In one or more embodiments, the chip liner 310 may be configured to connect (e.g. electrically and/or physically connect) at least one circuit included in the chip 302 to the at least one bonding pad 304. Accordingly, in one or more embodiments, forming the chip liner 310 may include forming an opening (e.g. a hole, a via (e.g. a thru-silicon via), a trench, a cavity, a deepening) in the surface 302a of the chip and depositing the chip liner 310 within the opening and over a part of the surface 302a of the chip 302. In one or more embodiments, the chip liner 310 formed within the opening may connect (e.g. electrically and/or physically connect) at least one circuit included in the chip 302 to the at least one bonding pad 304. In one or more embodiments, the opening may be formed by means of an etching process (e.g. a wet-etch process and/or a dry-etch process, for example a plasma etch process). In one or more embodiments, the at least one bonding pad 304 may be formed on the chip 302 after forming the chip liner 310.

In one or more embodiments, the chip liner 310 may include, or may consist of, a metal or metal alloy. In one or more embodiments, the metal may include at least one metal selected from a group of metals, the group consisting of: copper, titanium, wolfram, aluminium, chromium and gold, or an alloy containing at least one of the aforementioned metals.

FIG. 3C shows a cross-sectional view of a chip arrangement according to various embodiments.

As shown in FIG. 3C in a view 303, the chip arrangement may include a pillar liner 312 formed on at least a part of the surface 304a of the at least one bonding pad 304 facing away from the chip 302. In one or more embodiments, the pillar liner 312 may be interposed between the at least one bonding pad 304 and at least one pillar of the plurality of pillars 306 (as shown in FIG. 3C). In one or more embodiments, the pillar liner 312 may be formed on the at least one bonding pad 304 (e.g. on at least a part of the surface 304a of the at least one bonding pad 304) before forming the at least one pillar 306 on the at least one bonding pad 304.

In one or more embodiments, the pillar liner 312 may be formed by means of a deposition process such as, for example, at least one of a plating process, a chemical vapor deposition (CVD) process, a low-pressure CVD (LPCVD) process, a plasma-enhanced chemical vapor deposition (PECVD) process, a high-density plasma chemical vapor deposition (HDP-CVD) process, a physical vapor deposition (PVD) process, and a sputtering process, or other suitable deposition processes.

In one or more embodiments, the deposition process may be performed in conjunction with a patterned deposition mask, which may be formed over at least a part of the surface 304a of the at least one bonding pad 304 facing away from the chip 302. In accordance with an embodiment, the patterned deposition mask may be formed by depositing a masking material over the surface 304a of the at least one bonding pad 304 and over the surface 302a of the chip 302, and patterning the masking material to form the patterned deposition mask. In one or more embodiments, patterning the masking material may include, or may consist of, a lithographic process (e.g. a photo-lithographic process.) In one or more embodiments, the patterned deposition mask may be removed after forming the pillar liner 312.

In one or more embodiments, the pillar liner 312 may include, or may consist of, a metal or metal alloy. In one or more embodiments, the metal may include at least one metal selected from a group of metals, the group consisting of:

copper, titanium, wolfram, aluminium, chromium and gold, or an alloy containing at least one of the aforementioned metals.

Figure 4:
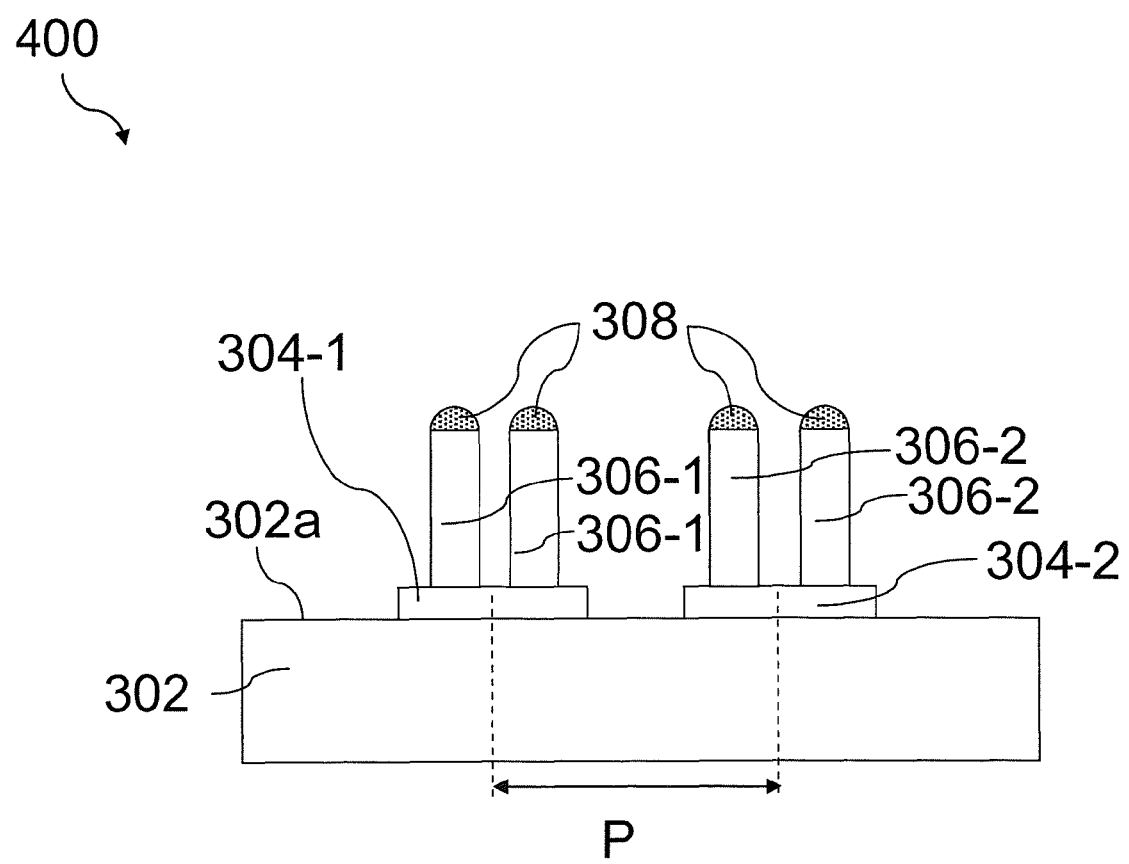
FIG. 4 shows a cross-sectional view of a chip arrangement according to various embodiments.

FIG. 4 shows a cross-sectional view 400 of a chip arrangement according to various embodiments.

Reference signs in FIG. 4 that are the same as in FIG. 3A to FIG. 3C denote the same or similar elements as in FIG. 3A to FIG. 3C. Thus, those elements will not be described in detail again here; reference is made to the description above. Differences between FIG. 4 and FIG. 3A to FIG. 3C are described below.

In one or more embodiments, the chip 302 may include a plurality of bonding pads 304-1, 304-2. In one or more embodiments, a plurality of pillars 306-1, 306-2 may be formed on the plurality of bonding pads 304-2, 304-2. For example, in the embodiment shown in FIG. 4, a group of pillars including a plurality of pillars 306-1 may be formed on the bonding pad 304-1, and another group of pillars including a plurality of pillars 306-2 may be formed on the bonding pad 304-2.

Only two bonding pads 304-1, 304-2 are shown as an example, however the number of bonding pads may be greater than two, and may, for example, be three, four, five, six, seven, eight, nine, or on the order of tens, hundreds, thousands of, or even more bonding pads in some embodiments. In like manner, only two pillars are shown on each bonding pad of the plurality of bonding pads 304-1, 304-2 as an example (e.g. two pillars 306-1 on bonding pad 304-1, and two pillars 306-2 on bonding pad 304-2), however the number of pillars formed on a bonding pad of the plurality of bonding pads may be greater than two and may, for example, be three, four, five, six, seven, eight, nine, or on the order of tens, hundreds of, or even more, pillars in some embodiments.

As described above in connection to FIG. 3A, the width W of a pillar of the plurality of pillars may be in the range from about 5 µm to about 25 µm, for example in the range from about 8 µm to about 25 µm, for example in the range from about 10 µm to about 25 µm, for example in the range from about 12 µm to about 22 µm, for example in the range from about 12 µm to about 20 µm, for example in the range from about 12 µm to about 18 µm, for example in the range from about 12 µm to about 17 µm, for example about 15 µm, although other values may be possible as well in accordance with other embodiments.

An effect of the width W of a pillar of the plurality of pillars being in the range from about 5 µm to about 25 µm may be that a bonding pad 304-1 may be placed closer to another bonding pad 304-2, for example a bonding pad adjacent to the bonding pad 304-1. A distance between a bonding pad 304-1 and another bonding pad 304-2 (e.g. an adjacent bonding pad 304-1) may be reduced. This distance may be referred to as "a pad pitch P". An effect of one or more embodiments may be reduction in pad pitch P. An effect of one or more embodiments may be an increase in pad density, namely, the number of pads per unit area of the surface 302a of the chip 302.

As described above in connection with FIG. 3A, the bonding pads 304-1 and 304-2 may include, or may be, an input/output (I/O) pad, although other types of pads of the chip 302 (e.g. a test pad, a power pad, and a ground pad) may be possible as well in accordance with other embodiments. Similarly, as described above in connection with FIG. 3A, the bonding pads 304-1 and 304-2 may include, or may be, an input/output (I/O) signal line, although other types of lines (a test signal line, a power line, and a ground line) may be possible as well in accordance with other embodiments.

In one or more embodiments, the bonding pad 304-1 may be part of a signal supply network (e.g. a network providing a first I/O signal). In an embodiment, the bonding pad 304-2 may be part of the same signal supply network as the bonding pad 304-1. Stated differently, the bonding pad 304-1 and the bonding pad 304-2 may belong to the same I/O network. Stated in yet another way, the bonding pad 304-1 and the bonding pad 304-2 may be configured to carry identical I/O signals.

In another embodiment, the bonding pad 304-1 and the bonding pad 304-2 may be part of different signal supply networks. Stated differently, the bonding pad 304-1 and the bonding pad 304-2 may belong to different I/O networks. Stated in yet another way, the bonding pad 304-1 and the bonding pad 304-2 may be configured to carry different I/O signals.

In one or more embodiments, the pad pitch P of bonding pads 304-1, 304-2 belonging to different signal networks may be greater than or equal to about 40 µm, for example in the range from about 40 µm to about 80 µm, for example in the range from about 40 µm to about 70 µm, for example in the range from about 40 µm to about 65 µm, for example in the range from about 40 µm to about 60 µm, for example about 50 µm, although other values may be possible as well in accordance with other embodiments.

In one or more embodiments, the pad pitch P of bonding pads 304-1, 304-2 belonging to the same signal network may be less than or equal to about 50 µm, for example, less than or equal to about 40 µm, for example in the range from about 15 µm to about 40 µm, for example in the range from about 20 µm to about 40 µm, for example in the range from about 30 µm to about 40 µm, for example about 35 µm, although other values may be possible as well in accordance with other embodiments.

FIG. 5A to FIG. 5D shows cross-sectional views of chip arrangements according to various embodiments.

Reference signs in FIG. 5A to FIG. 5D that are the same as in FIG. 3A to FIG. 3C denote the same or similar elements as in FIG. 3A to FIG. 3C. Thus, those elements will not be described in detail again here; reference is made to the description above. Differences between FIG. 5A to FIG. 5D and FIG. 3A to FIG. 3C are described below.

Figure 5A:
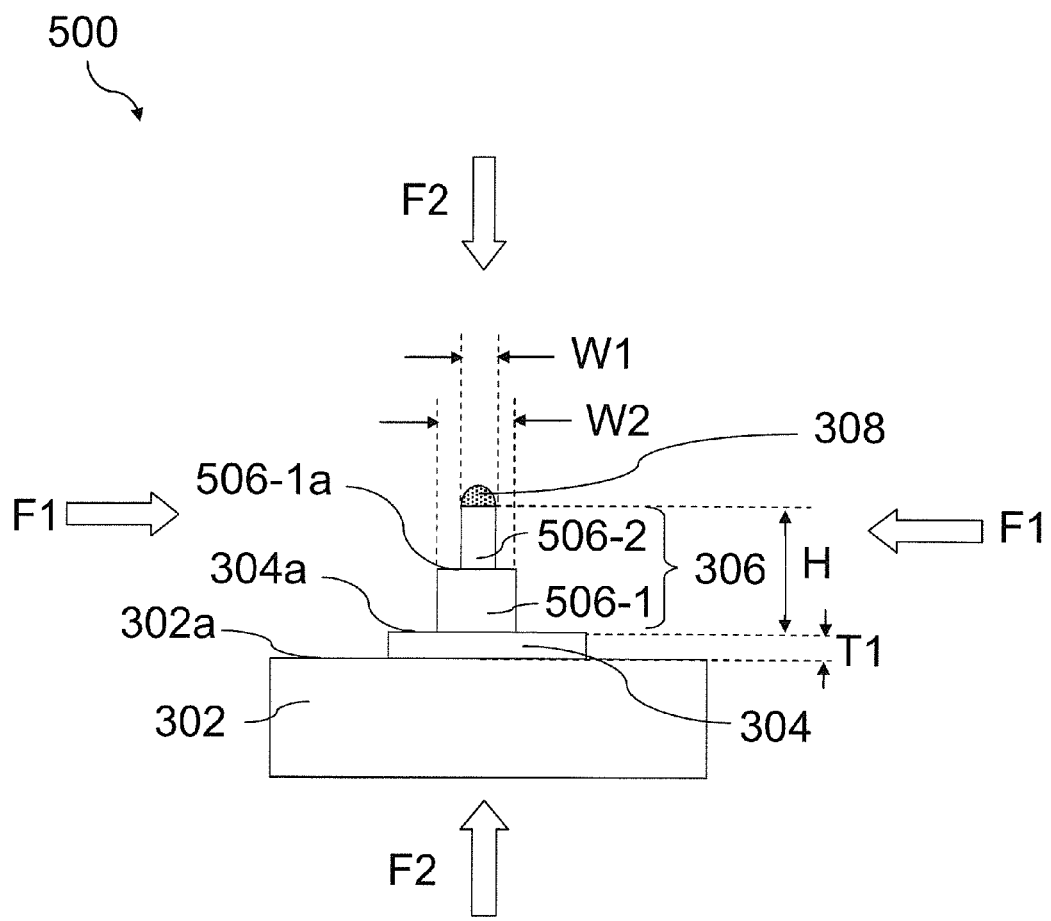
FIG. 5A to FIG. 5D shows cross-sectional views of chip arrangements according to various embodiments.

As shown in FIG. 5A in a view 500, a chip arrangement may include a chip 302 including at least one bonding pad 304, and a plurality of pillars 306 formed on the at least one bonding pad 304.

Only one bonding pad 304 is shown as an example, however the number of bonding pads may be greater than one, and may, for example, be two, three, four, five, six, seven, eight, nine, or on the order of tens, hundreds, thousands of, or even more bonding pads in some embodiments. Only one pillar 306 of the plurality of pillars formed on the at least one bonding pad 304 is shown as an example, however the number of pillars may be greater than one and may, for example, be two, three, four, five, six, seven, eight, nine, or on the order of tens, hundreds of, or even more, pillars in some embodiments In one or more embodiments, a pillar of the plurality of pillars 306 may include a plurality of segments 506-1, 506-2 arranged over each other. Only two segments 506-1, 506-2 are shown as an example, however the number of segments may be greater than two, and may, for example, be three, four, five, six, seven, eight, nine, or on the order of tens, or even more segments in some embodiments.

In one or more embodiments, each segment of the plurality of segments 506-1, 506-2 may be formed by means of a deposition process such as, for example, at least one of a plating process, a chemical vapor deposition (CVD) process, a low-pressure CVD (LPCVD) process, a plasma-enhanced chemical vapor deposition (PECVD) process, a high-density plasma chemical vapor deposition (HDP-CVD) process, a physical vapor deposition (PVD) process, and a sputtering process, or other suitable deposition processes.

In one or more embodiments, the deposition process may be performed in conjunction with a patterned deposition mask.

For example, a first segment 506-1 may be formed with a first patterned deposition mask formed over at least a part of the surface 304a of the at least one bonding pad 304 facing away from the chip 302. In accordance with an embodiment, the first patterned deposition mask may be formed by depositing a masking material over the surface 304a of the at least one bonding pad 304 facing away from the chip 302 and over the surface 302a of the chip 302, and patterning the masking material to form the first patterned deposition mask. In one or more embodiments, patterning the masking material may include, or may consist of, a lithographic process (e.g. a photo-lithographic process). In one or more embodiments, the first patterned deposition mask may be removed after forming the first segment 506-1.

In an embodiment, a second first segment 506-2 of a pillar of the plurality of pillars 306 may be formed with a second patterned deposition mask formed over at least a part of a surface 506-1a of the first segment 506-1 facing away from the chip 302. In accordance with an embodiment, the second patterned deposition mask may be formed by depositing a masking material over the surface 506-1a of the first segment 506-1, and over the surface 304a of the at least one bonding pad 304 facing away from the chip 302 and over the surface 302a of the chip 302, and patterning the masking material to form the second patterned deposition mask. In one or more embodiments, patterning the masking material may include, or may consist of, a lithographic process (e.g. a photo-lithographic process). In one or more embodiments, the second patterned deposition mask may be removed after forming the second segment 506-2.

As described above, a height H of a pillar of the plurality of pillars 306 may be measured in a direction perpendicular to the surface 302a of the chip 302. In one or more embodiments, a height H may be a total height of the plurality of segments 506-1, 506-2 arranged over each other. For example, in FIG. 5A the first segment 506-1 may have a height H1 and the second segment 506-2 may have a height H2. Accordingly, the height H of the pillar 306 shown in FIG. 5A may be calculated as a total of the height of the plurality of segments 506-1, 506-2 arranged over each other, i.e., H=H1+H2.

As described above, the height H may be greater than or equal to about 10 μm, for example greater than or equal to about 20 μm, for example greater than or equal to about 30 μm, for example greater than or equal to about 40 μm, for example in the range from about 40 μm to about 100 μm, for example in the range from about 40 μm to about 80 μm, for example in the range from about 40 μm to about 60 μm, for example about 50 μm, although other values may be possible as well in accordance with other embodiments.

In one or more embodiments, each segment of the plurality of segments 506-1, 506-2 may have a different width. For example, in FIG. 5A the first segment 506-1 may have a width W1, and the second segment 506-2 may have a width W2.

As described above in connection with FIG. 3A, a width W of a pillar of the plurality of pillars 306 may be measured as a widest lateral extent of the pillar in a direction perpendicular to the height H. In one or more embodiments, the width W of a pillar of the plurality of pillars 306 may refer to the width of a widest part of the pillar, i.e. W=W1.

In one or more embodiments, the width W of a pillar of the plurality of pillars 306 may be in the range from about 5 μm to about 25 μm, for example in the range from about 8 μm to about 25 μm, for example in the range from about 10 μm to about 25 μm, for example in the range from about 12 μm to about 22 μm, for example in the range from about 12 μm to about 20 μm, for example in the range from about 12 μm to about 18 μm, for example in the range from about 12 μm to about 17 μm, for example about 15 μm, although other values may be possible as well in accordance with other embodiments.

As described above in connection with FIG. 3A, an aspect ratio of a pillar of the plurality of pillars may be calculated as a ratio of the height H to the width W of the pillar, in other words H:W. In accordance with an embodiment, the aspect ratio (H:W) of the pillar 306 shown in FIG. 5A including a plurality of segments 506-1, 506-2 may be greater than or equal to about 2, for example greater than or equal to about 2.5, for example greater than or equal to about 3, for example, greater than or equal to about 5, although other values may be possible as well in accordance with other embodiments.

In one or more embodiments, a segment of a pillar of the plurality of pillars 306 with a smaller width may be arranged further from the chip 302 than another segment with a larger width. For example, the first segment 506-1 of the pillar 306 shown in FIG. 5A may have a larger width W1 than the second segment 506-2 of the at least one pillar 306. Accordingly, the second segment 506-2 may be arranged further from the chip 302 that the first segment 506-1.

An effect of this arrangement may be a distribution of at least one of a lateral force F1 and a compressive force F2 in the plurality of pillars 306. Therefore, an effect of one or more embodiments may be reduction in breakage of an interconnection between the chip 302 and a chip-external connection region (e.g. a bonding pad of another chip and/or a trace on a substrate, for example, a substrate of a chip package). An effect of one or more embodiments may be increased reliability in an interconnection between the chip 302 and a chip-external connection region (e.g. a bonding pad of another chip and/or a trace on a substrate, for example, a substrate of a chip package).

Figure 5B:
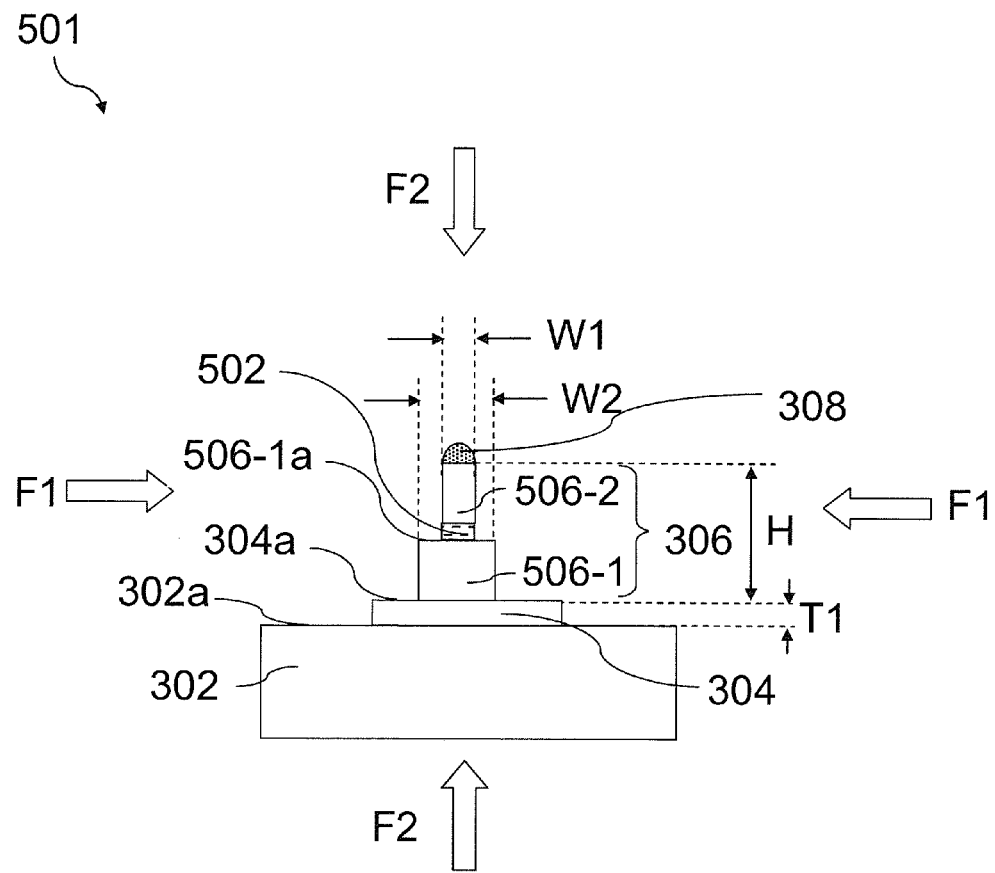

FIG. 5B shows a cross-sectional view of a chip arrangement according to various embodiments.

As shown in FIG. 5B in a view 501, the chip 302 may include at least one segment liner 502 formed between at least one pair of adjacent segments 506-1, 506-2 of a pillar of the plurality of pillars 306 (as shown in FIG. 5B).

In one or more embodiments, the segment liner 502 may be formed by means of a deposition process such as, for example, at least one of a plating process, a chemical vapor deposition (CVD) process, a low-pressure CVD (LPCVD) process, a plasma-enhanced chemical vapor deposition (PECVD) process, a high-density plasma chemical vapor deposition (HDP-CVD) process, a physical vapor deposition (PVD) process, and a sputtering process, or other suitable deposition processes.

In one or more embodiments, the segment liner 502 may include, or may consist of, a metal or metal alloy. In one or more embodiments, the metal may include at least one metal selected from a group of metals, the group consisting of: copper, titanium, wolfram, aluminium, chromium and gold, or an alloy containing at least one of the aforementioned metals.

In one or more embodiments, the height H of a pillar of the plurality of pillars 306 may include a thickness of the segment liner 502 (as shown in FIG. 5B).

Figure 5C:
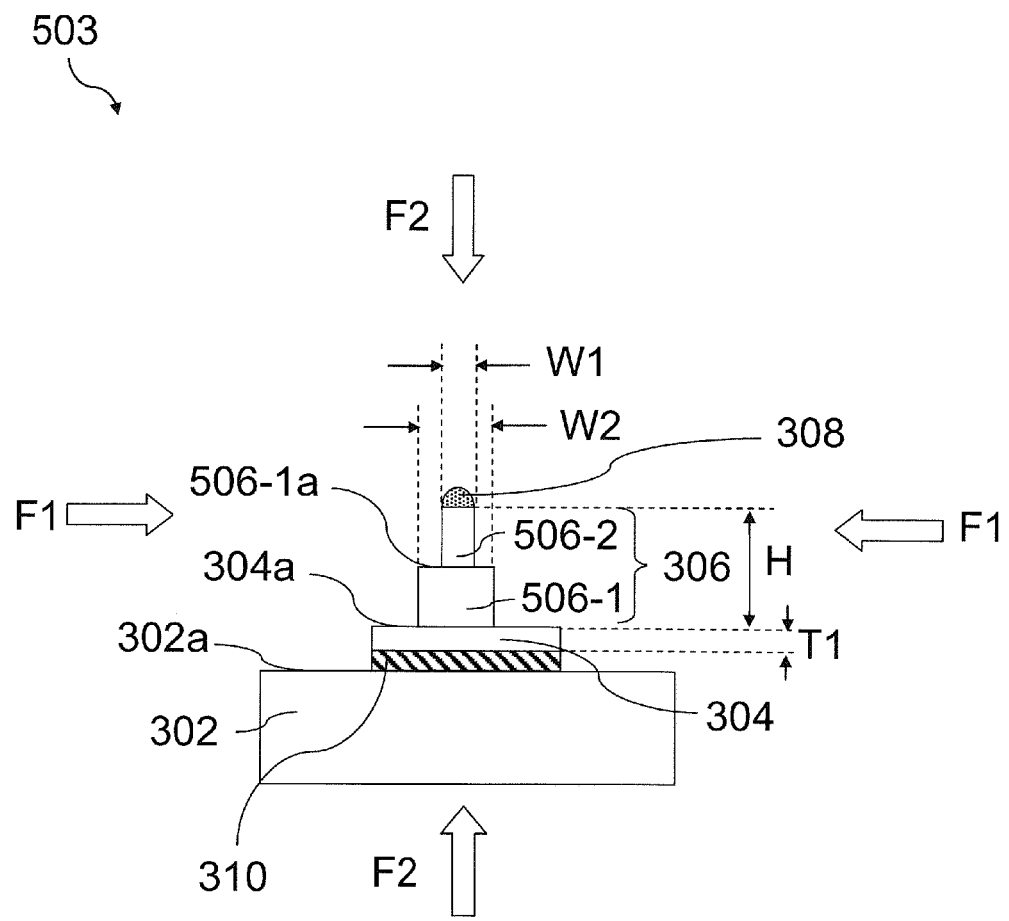

As shown in FIG. 5C in a view 503, the chip 302 may include a chip liner 310 formed on at least a part of the surface 302a of the chip 302. In one or more embodiments, the chip liner 310 may be interposed between the chip 302 and the at least one bonding pad 304 (as shown in FIG. 5C). In such an embodiment, forming the at least one bonding pad 304 on the surface 302a of the chip 302 may include forming the at least one bonding pad 304 on the chip liner 310.

As described above in connection with FIG. 3B, the chip liner 310 may be formed by means of a deposition process such as, for example, at least one of a plating process, a chemical vapor deposition (CVD) process, a low-pressure CVD (LPCVD) process, a plasma-enhanced chemical vapor deposition (PECVD) process, a high-density plasma chemical vapor deposition (HDP-CVD) process, a physical vapor deposition (PVD) process, and a sputtering process, or other suitable deposition processes.

Figure 5D:
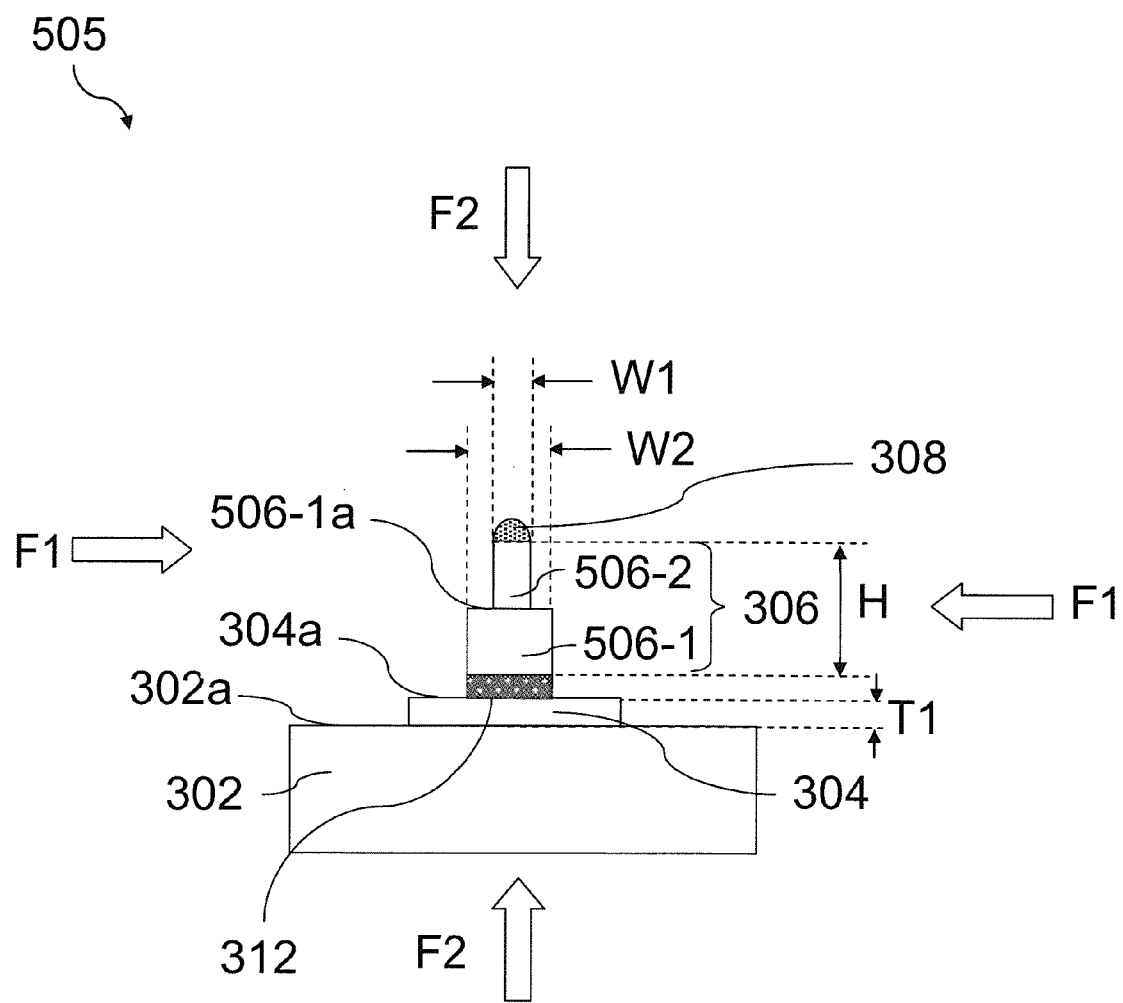

As shown in FIG. 5D in a view 505, the chip arrangement may include a pillar liner 312 formed on at least a part of the surface 304a of the at least one bonding pad 304 facing away from the chip 302. In one or more embodiments, the pillar liner 312 may be interposed between the at least one bonding pad 304 and a pillar of the plurality of pillars 306 (as shown in FIG. 5D). In one or more embodiments, the pillar liner may be formed on the at least one bonding pad 304 (e.g. on at least a part of the surface 304a of the at least one bonding pad 304) before forming the plurality of pillars 306 on the at least one bonding pad 304.

As described above in connection with FIG. 3C, the pillar liner 312 may be formed by means of a deposition process such as, for example, at least one of a plating process, a chemical vapor deposition (CVD) process, a low-pressure CVD (LPCVD) process, a plasma-enhanced chemical vapor deposition (PECVD) process, a high-density plasma chemical vapor deposition (HDP-CVD) process, a physical vapor deposition (PVD) process, and a sputtering process, or other suitable deposition processes.

Figure 6:
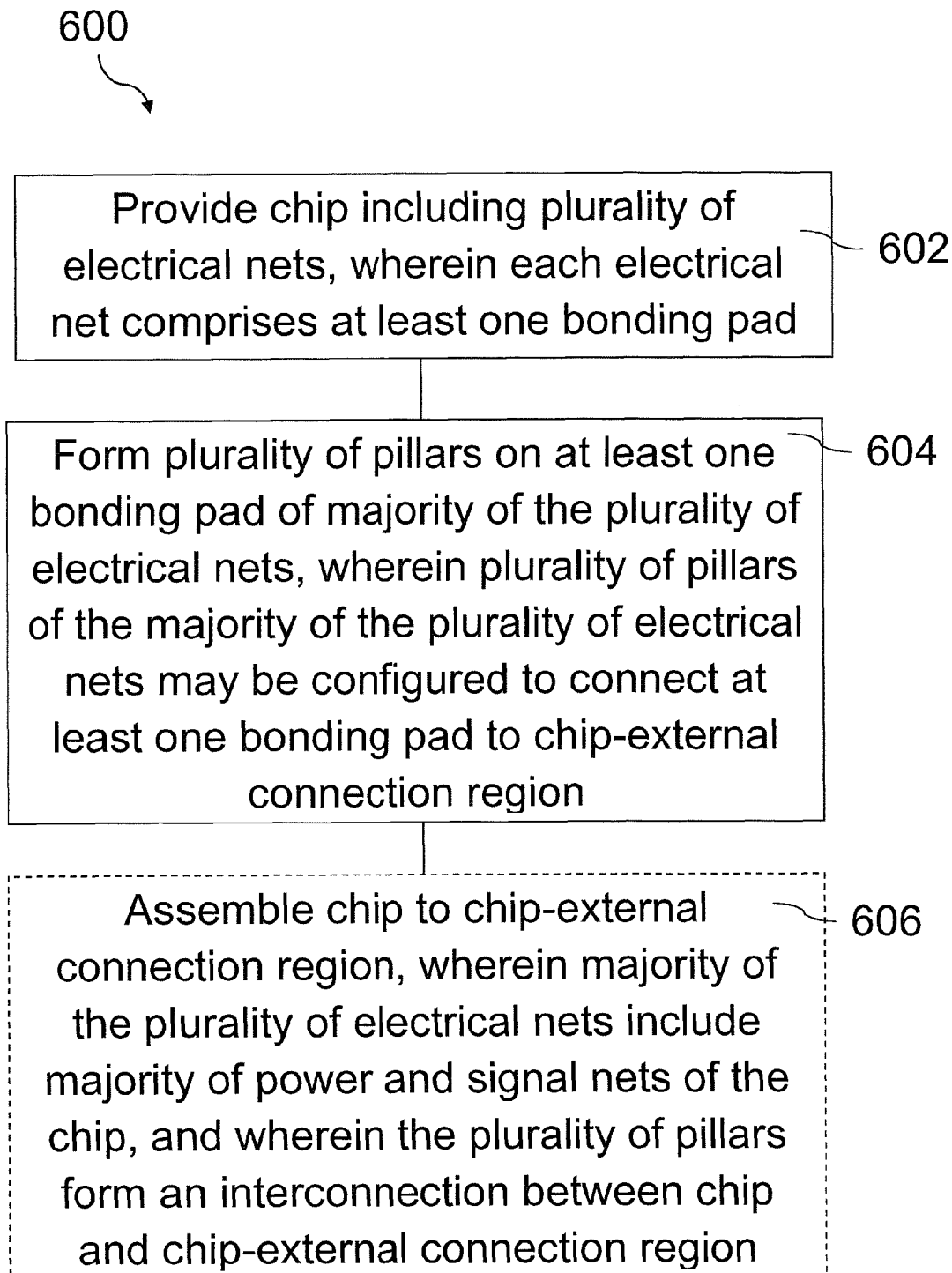
FIG. 6 shows a method for forming a chip arrangement in accordance with various embodiments.

FIG. 6 shows a method 600 for forming a chip arrangement in accordance with various embodiments.

In one or more embodiments, the method 600 for forming the chip arrangement may, for example, be used to form a chip arrangement shown in at least one of FIG. 3A to FIG. 3C, FIG. 4, and FIG. 5A to FIG. 5D.

In one or more embodiments, the method 600 for forming a chip arrangement may include: providing a chip including a plurality of electrical nets, wherein each electrical net comprises at least one bonding pad (in 602); and forming a plurality of pillars on the at least one bonding pad of a majority of the plurality of electrical nets, wherein the plurality of pillars may be configured to connect the at least one bonding pad to a chip-external connection region (in 604).

The method 600 may further include assembling the chip to the chip-external connection region, wherein the majority of the plurality of electrical nets may include a majority of power and signal nets of the chip, and wherein the plurality of pillars may form an interconnection between the chip and the chip-external connection region (in 606). In other words, the electrical nets may include power nets and signal nets of the chip, It is noted that prior to assembling the chip to the chip-external connection region (in 606) and after forming the plurality of pillars (in 604), an optical test and/or an optical inspection may be performed, e.g. to ensure that pillars of a desired dimension are formed on the at least one bonding pad of the majority of the plurality of electrical nets.

FIG. 7 shows a method 700 for forming a chip arrangement in accordance with various embodiments.

In one or more embodiments, the method 700 for forming the chip arrangement may, for example, be used to form a chip arrangement shown in at least one of FIG. 3A to FIG. 3C, FIG. 4, and FIG. 5A to FIG. 5D.

In one or more embodiments, the method 700 for forming a chip arrangement may include: providing a chip including at least one bonding pad (in 702); and forming a plurality of pillars on the at least one bonding pad, wherein the plurality of pillars may be configured to connect the at least one bonding pad to a chip-external connection region, and wherein a ratio of a height of a pillar of the plurality of pillars to a width of a widest lateral extent of the pillar of the plurality of pillars may be greater than or equal to about 2 (in 704).

Figure 8:
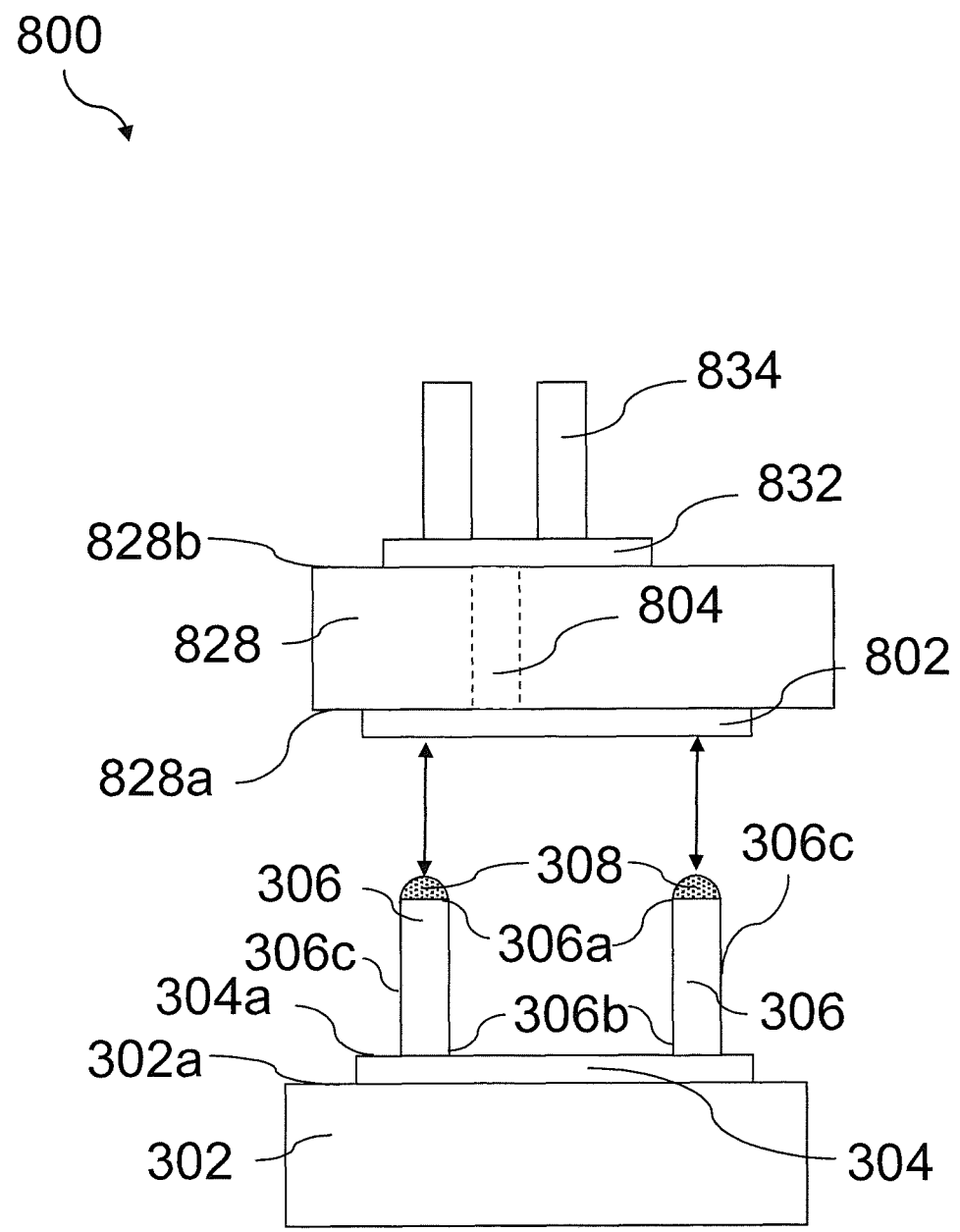
FIG. 8 shows a cross-sectional view of a chip arrangement including a chip-external connection region according to various embodiments.

FIG. 8 shows a cross-sectional view 800 of a chip arrangement according to various embodiments.

Reference signs in FIG. 8 that are the same as in FIG. 3A to FIG. 3C denote the same or similar elements as in FIG. 3A to FIG. 3C. Thus, those elements will not be described in detail again here; reference is made to the description above. Differences between FIG. 8 and FIG. 3A to FIG. 3C are described below.

As shown in FIG. 8, a chip arrangement may include a chip 302 including at least one bonding pad 304, and a plurality of pillars 306 formed on the at least one bonding pad 304; a chip-external connection region 828 including at least one trace 832 formed on a surface 828b of the chip-external connection region 828 facing away from the chip 302; and a plurality of conductive interconnects 837 formed on a trace of the at least one trace 832.

The chip-external connection region 828 shown in FIG. 8 may, for example, be identified with the chip-external connection region 228 shown in FIG. 2. In like manner, the at least one trace 832 shown in FIG. 8 may, for example, be identified with the at least one trace 232 shown in FIG. 2. Similarly, the plurality of conductive interconnects 834 shown in FIG. 8 may, for example, be identified with the plurality of conductive interconnects 234 shown in FIG. 2. The at least one trace 832 may be connected (e.g. by means of at least one via 804) to a trace 802 formed on a surface 828a of the chip-external connection region 828 facing the chip 302, as shown in FIG. 8.

As described above, a height H of a pillar of the plurality of pillars 306 may refer to an effective height of an interconnection between the chip 302 and a chip-external connection region 828. For example, the effective height H may be the sum of the height H1 of a pillar 306 formed on the chip 302 and the height H2 of an interconnect (e.g. pillar) formed on the chip external connection region. For example, H=H1+H2. In other words, the effective height H of a pillar of the plurality of pillars 306 may be reached or extended by the introduction of an interconnect 830 (e.g. pillar) on a trace 802 (e.g. landing pad e.g. exposed landing pad) of the chip external connection region 828. In some examples, the effective height H of the pillar 306 formed on the chip 302 may include a height Hx of an interconnect (e.g. solder joint) that may, for example, be disposed between the pillar 306 formed on the chip 302 and the an interconnect 830 (e.g. pillar) formed on the chip external connection region. For example, H=H1+H1+Hx. Accordingly, a ratio of a value to a height H of a pillar of the plurality of pillars 306 may be calculated using the effective height H of an interconnection between the chip 302 and a chip-external connection region 828, i.e. H=H1+H2 or H=H1+H1+Hx. In one or more embodiments, the effective height H of an interconnection between the chip 302 and a chip-external connection region 828 may be in the range of greater than or equal to about 30 µm, for example greater than or equal to about 40 µm, for example greater than or equal to about 60 µm, for example greater than or equal to about 80 µm, for example greater than or equal to about 90 µm, for example about 100 µm.

In one or more embodiments, the plurality of conductive interconnects 834 may include, or may be, at least one interconnect selected from a group of interconnects, the group consisting of: a solder ball, a pillar (e.g. a plated pillar), a bump (e.g. a stud bump), a wire bond, and a conductive glue deposit, although other interconnects may be possible as well in accordance with other embodiments. Multiple processes may use a solder deposit that is either placed on the pillar, the chip external region, or on both sides of the interconnect.

In one or more embodiments, a design of the at least one trace 832 and of a conductive interconnect of the plurality of conductive interconnects 834 may be similar to a design of the at least one bonding pad 304 and of at least pillar of the plurality of pillars 306, respectively. Accordingly, effects provided by the embodiments shown in FIG. 3A to FIG. 3C, FIG. 4, and FIG. 5A to FIG. 5D may be equally applicable to the embodiment shown in FIG. 8.

According to one or more embodiments, a chip arrangement may be provided. In one or more embodiments, the chip arrangement may include: a chip including at least one bonding pad; and a plurality of pillars formed on the at least one bonding pad, wherein the plurality of pillars may be configured to connect the at least one bonding pad to a chip-external connection region.

In one or more embodiments, the at least one bonding pad may include an input/output pad.

In one or more embodiments, the at least one bonding pad may include an input/output signal line.

In one or more embodiments, the chip may include, or may be, a chip having a high pin count.

In one or more embodiments, a ratio of a height of at least one pillar of the plurality of pillars to a width of a widest lateral extent of the at least one pillar may be greater than or equal to about 2.

In one or more embodiments, a width of a widest lateral extent of at least one pillar of the plurality of pillars may be in the range from about 5 µm to about 25 µm.

In one or more embodiments, a height of at least one pillar of the plurality of pillars may be greater than or equal to about 10 µm.

In one or more embodiments, a thickness of the at least one bonding pad may be in the range from about 3 µm to about 8 µm.

In one or more embodiments, a ratio of a thickness of the at least one bonding pad to a width of a widest lateral extent of at least one pillar of the plurality of pillars may be greater than or equal to about 0.2.

In one or more embodiments, at least one pillar of the plurality of pillars may include a plurality of segments arranged over each other, where each segment of the plurality of segments may have a different width.

In one or more embodiments, a segment of the at least one pillar with a smaller width may be arranged further from the chip than another segment of the at least one pillar with a larger width.

In one or more embodiments, the at least one pillar may further include a segment liner formed between at least one pair of adjacent segments of the at least one pillar.

In one or more embodiments, the chip may further include a chip liner formed on a surface of the chip, wherein the surface of the chip may be configured to face the chip-external connection region, and wherein the chip liner may be interposed between the chip and the at least one bonding pad.

In one or more embodiments, the chip arrangement may further include a pillar liner formed on at least a part of a surface of the at least one bonding pad facing away from the chip, the pillar liner interposed between the at least one bonding pad and at least one pillar of the plurality of pillars.

In one or more embodiments, the chip may include a plurality of bonding pads, wherein the plurality of pillars may be formed on the plurality of bonding pads.

In one or more embodiments, the plurality of bonding pads may include a first group of bonding pads and a second group of bonding pads, wherein the first group of bonding pads may include at least one bonding pad configured to carry one input/output signal, and wherein the second group of bonding pads may include at least one bonding pad configured to carry another input/output signal.

In one or more embodiments, a pad pitch between a bonding pad of the first group and a bonding pad of the second group may be greater than or equal to about 40 µm.

In one or more embodiments, the first group of bonding pads may further include a plurality of bonding pads.

In one or more embodiments, a pad pitch between a bonding pad of the first group and another bonding pad of the first group may be less than or equal to about 50 µm.

In one or more embodiments, the chip arrangement may further include: a chip-external connection region including at least one trace formed on a surface of the chip-external connection region facing away from the chip; and a plurality of conductive interconnects formed on the at least one trace.

In one or more embodiments, the plurality of conductive interconnects may include at least one interconnect selected from a group of interconnects, the group consisting of: a solder ball, a pillar, a bump, a wire bond, and a conductive glue deposit.

In one or more embodiments, a ratio of a height of at least one conductive interconnect of the plurality of conductive interconnects to a width of a widest lateral extent of the at least one conductive interconnect may be greater than or equal to about 2.

In one or more embodiments, a ratio of a thickness of the at least one trace to a width of a widest lateral extent of at least one conductive interconnect of the plurality of conductive interconnects may be greater than or equal to about 0.2.

According to one or more embodiments, a chip arrangement may be provided. In one or more embodiments, the chip arrangement may include: a chip including at least one input/output pad; and a plurality of pillars formed on the at least one input/output pad, wherein the plurality of pillars may be configured to connect the at least one input/output pad to a chip-external connection region.

In one or more embodiments, a ratio of a height of a pillar of the plurality of pillars to a width of a widest lateral extent of the pillar of the plurality of pillars may be greater than or equal to about 2.

In one or more embodiments, a ratio of a thickness of the at least one input/output pad to a width of a widest lateral extent of the pillar of the plurality of pillars may be greater than or equal to about 0.2.

According to one or more embodiments, a method for forming a chip arrangement may be provided. In one or more embodiments, the method may include: providing a chip including at least one bonding pad; and forming a plurality of pillars on the at least one bonding pad, wherein the plurality of pillars may be configured to connect the at least one bonding pad to a chip-external connection region.

According to one or more embodiments, a method for forming a chip arrangement may be provided. In one or more embodiments, the method may include: providing a chip including at least one bonding pad; and forming a plurality of pillars on the at least one bonding pad, wherein the plurality of pillars may be configured to connect the at least one bonding pad to a chip-external connection region, and wherein a ratio of a height of a pillar of the plurality of pillars to a width of a widest lateral extent of the pillar of the plurality of pillars may be greater than or equal to about 2.

Various examples and aspects described in the context of one of the chip arrangements or methods described herein may be analogously valid for the other chip arrangements or methods described herein.

While various aspects of this disclosure have been particularly shown and described with reference to these aspects of this disclosure, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A chip arrangement, comprising:
   a chip comprising a plurality of electrical nets, wherein each electrical net comprises at least one bonding pad; and
   a plurality of pillars formed on the at least one bonding pad of a majority of the plurality of electrical nets,
   wherein the plurality of pillars is configured to connect the at least one bonding pad of the majority of the plurality of electrical nets to a chip-external connection region and wherein a ratio of a height of at least one pillar of the plurality of pillars to a width of a widest lateral extent of the at least one pillar is greater than or equal to about 2.

2. The chip arrangement of claim 1, wherein the plurality of electrical nets comprises an input or output net and a supply net.

3. The chip arrangement of claim 1, wherein the chip comprises a high pin-count chip having a plurality of pins, wherein the plurality of pins comprises a plurality of digital or analog signal pins, and wherein the high pin-count chip comprises at least one supply net.

4. The chip arrangement of claim 1, wherein a width of a widest lateral extent of at least one pillar of the plurality of pillars is in the range from about 5 µm to about 25 µm.

5. The chip arrangement of claim 1, wherein a height of at least one pillar of the plurality of pillars is greater than or equal to about 10 µm.

6. The chip arrangement of claim 1, wherein a thickness of the at least one bonding pad is in the range from about 3 µm to about 8 µm.

7. The chip arrangement of claim 1, wherein a ratio of a thickness of the at least one bonding pad to a width of a widest lateral extent of at least one pillar of the plurality of pillars is greater than or equal to about 0.2.

8. The chip arrangement of claim 1, wherein at least one pillar of the plurality of pillars comprises a plurality of segments arranged over each other, and wherein each segment of the plurality of segments has a different width.

9. The chip arrangement of claim 8, wherein a segment of the at least one pillar with a smaller width is arranged further from the chip than another segment of the at least one pillar with a larger width.

10. The chip arrangement of claim 8, wherein the at least one pillar further comprises a segment liner formed between at least one pair of adjacent segments of the at least one pillar.

11. The chip arrangement of claim 1, wherein the chip comprises:
   a plurality of bonding pads, wherein the plurality of pillars is formed on the plurality of bonding pads, and wherein the chip-external connection region is another chip.

12. The chip arrangement of claim 11, wherein the plurality of bonding pads comprises a first group of bonding pads and a second group of bonding pads, wherein the first group of bonding pads comprises at least one bonding pad configured to carry one input/output signal, and wherein the second group of bonding pads comprises at least one bonding pad configured to carry another input/output signal.

13. The chip arrangement of claim 12, wherein a pad pitch between a bonding pad of the first group and a bonding pad of the second group is greater than or equal to about 40 µm.

14. The chip arrangement of claim 12, wherein the first group of bonding pads further comprises a plurality of bonding pads.

15. The chip arrangement of claim 14, wherein a pad pitch between a bonding pad of the first group and another bonding pad of the first group is less than or equal to about 50 µm.

16. The chip arrangement of claim 1, further comprising:
   a chip-external connection region comprising at least one trace formed on a surface of the chip-external connection region facing away from the chip; and
   a plurality of conductive interconnects formed on the at least one trace.

17. The chip arrangement of claim 16, wherein the plurality of conductive interconnects comprises at least one interconnect selected from a group of interconnects, the group consisting of: a solder ball, a pillar, a bump, a wire bond, and a conductive glue deposit.

18. The chip arrangement of claim 16, wherein a ratio of a height of at least one conductive interconnect of the plurality of conductive interconnects to a width of a widest lateral extent of the at least one conductive interconnect is greater than or equal to about 2.

19. The chip arrangement of claim 16, wherein a ratio of a thickness of the at least one trace to a width of a widest lateral extent of at least one conductive interconnect of the plurality of conductive interconnects is greater than or equal to about 0.2.

20. A chip arrangement, comprising:
   a chip comprising a plurality of electrical nets, wherein each electrical net comprises at least one bonding pad;
   a plurality of pillars formed on the at least one bonding pad of a majority of the plurality of electrical nets,
   wherein a ratio of a thickness of the at least one bonding pad to a width of a widest lateral extent of at least one pillar of the plurality of pillars is greater than or equal to about 0.2,
   and wherein a ratio of a height of at least one pillar of the plurality of pillars to a width of a widest lateral extent of the at least one pillar is greater than or equal to about 2.

21. A chip arrangement, comprising:
   a chip comprising a plurality of electrical nets, wherein each electrical net comprises at least one bonding pad;
   at least one pillar formed on at least one bonding pad; and
   a chip external contact region comprising a contact pad electrically coupled to the at least one pillar,
   wherein a ratio of a total height of the at least one pillar of the chip and the contact pad of the chip external contact region to the smaller of the width of the at least one pillar and the width of the contact pad is greater than or equal to about 2.5.

22. The chip arrangement of claim 21, wherein a plurality of pillars are formed on the at least one bonding pad, wherein the chip external contact region comprises a plurality of contact pads, and wherein a majority of the plurality of contact pads are electrically coupled to the plurality of pillars.

23. The chip arrangement of claim 21, wherein a ratio of a height of the contact pad to a width of the contact pad is greater than or equal to about 1.

24. The chip arrangement of claim 21, wherein the chip external contact region is at least a part of another chip.

25. The chip arrangement of claim 21, wherein the chip external contact region is a carrier or an interposer comprising glass or a semiconductor material.

26. A method for forming a chip arrangement, comprising:
providing a chip comprising at least one bonding pad; and
forming a plurality of pillars on the at least one bonding pad, wherein the plurality of pillars is configured to connect the at least one bonding pad to a chip-external connection region, and wherein a ratio of a height of a pillar of the plurality of pillars to a width of a widest lateral extent of the pillar of the plurality of pillars is greater than or equal to about 2.

27. A chip arrangement, comprising:
a chip comprising a plurality of electrical nets, wherein each electrical net comprises at least one bonding pad; and
a plurality of pillars formed on the at least one bonding pad of a majority of the plurality of electrical nets,
wherein the plurality of pillars is configured to connect the at least one bonding pad of the majority of the plurality of electrical nets to a chip-external connection region and wherein at least one pillar of the plurality of pillars comprises a plurality of segments arranged over each other, and wherein each segment of the plurality of segments has a different width.

28. The chip arrangement of claim 27, wherein a ratio of a height of at least one pillar of the plurality of pillars to a width of a widest lateral extent of the at least one pillar is greater than or equal to about 2.

29. A chip arrangement, comprising:
a chip comprising a plurality of electrical nets, wherein each electrical net comprises at least one bonding pad; and
a plurality of pillars formed on the at least one bonding pad of a majority of the plurality of electrical nets,
wherein the plurality of pillars is configured to connect the at least one bonding pad of the majority of the plurality of electrical nets to a chip-external connection region, and wherein the chip comprises a plurality of bonding pads, wherein the plurality of pillars is formed on the plurality of bonding pads, and wherein the chip-external connection region is another chip.

30. The chip arrangement of claim 29, wherein a ratio of a height of at least one pillar of the plurality of pillars to a width of a widest lateral extent of the at least one pillar is greater than or equal to about 2.

31. The chip arrangement of claim 27, wherein the plurality of electrical nets comprises an input or output net and a supply net.

* * * * *